(12) United States Patent
Benson et al.

(10) Patent No.: US 7,629,250 B2
(45) Date of Patent: Dec. 8, 2009

(54) METHOD FOR CREATING ELECTRICALLY CONDUCTIVE ELEMENTS FOR SEMICONDUCTOR DEVICE STRUCTURES USING LASER ABLATION PROCESSES AND METHODS OF FABRICATING SEMICONDUCTOR DEVICE ASSEMBLIES

(75) Inventors: Peter A. Benson, Guilderland, NY (US); Charles M. Watkins, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 164 days.

(21) Appl. No.: 11/601,341

(22) Filed: Nov. 17, 2006

(65) Prior Publication Data

US 2007/0066048 A1 Mar. 22, 2007

Related U.S. Application Data

(63) Continuation of application No. 10/933,197, filed on Sep. 1, 2004, now Pat. No. 7,575,999.

(51) Int. Cl.
*H01L 21/4763* (2006.01)

(52) U.S. Cl. ............... 438/637; 438/107; 438/108; 438/598; 438/612; 438/613; 438/618; 438/622; 438/623; 438/638; 438/640; 438/641

(58) Field of Classification Search ......... 438/107–108, 438/598, 612–613, 618, 622, 623, 637–638, 438/640–641
See application file for complete search history.

(56) References Cited

U.S. PATENT DOCUMENTS

| 4,414,059 A | 11/1983 | Blum et al. |
| 4,508,749 A | 4/1985 | Brannon et al. |
| 4,568,632 A | 2/1986 | Blum et al. |
| 4,882,200 A | 11/1989 | Liu et al. |
| 5,173,442 A * | 12/1992 | Carey .................. 216/18 |
| 5,236,551 A | 8/1993 | Pan |
| 5,302,547 A | 4/1994 | Wojnarowski et al. |
| 5,411,918 A * | 5/1995 | Keible et al. .......... 257/737 |
| 5,505,320 A | 4/1996 | Burns et al. |

(Continued)

OTHER PUBLICATIONS

King, Bruce "Maskless Mesoscale Materials Deposition", Feb. 1, 2003 EP&P.

*Primary Examiner*—Kevin M Picardat
*Assistant Examiner*—Bac H Au
(74) *Attorney, Agent, or Firm*—TraskBritt

(57) ABSTRACT

A method for forming at least one conductive element is disclosed. Particularly, a semiconductor substrate, including a plurality of semiconductor dice thereon, may be provided and a dielectric layer may be formed thereover. At least one depression may be laser ablated in the dielectric layer and an electrically conductive material may be deposited thereinto. Also, a method for assembling a semiconductor die having a plurality of bond pads and a dielectric layer formed thereover to a carrier substrate having a plurality of terminal pads is disclosed. At least one depression may be laser ablated into the dielectric layer and a conductive material may be deposited thereinto for electrical communication between the semiconductor die and the carrier substrate. The semiconductor die may be affixed to the carrier substrate and at least one of the dielectric layer and the conductive material may remain substantially solid during affixation therebetween. The methods may be implemented at the wafer level.

30 Claims, 15 Drawing Sheets

U.S. PATENT DOCUMENTS

| | | | |
|---|---|---|---|
| 5,766,497 | A | 6/1998 | Mitwalsky et al. |
| 5,985,518 | A | 11/1999 | Huggins et al. |
| 6,107,109 | A | 8/2000 | Akram et al. |
| 6,114,240 | A | 9/2000 | Akram et al. |
| 6,190,940 | B1 | 2/2001 | DeFelice et al. |
| 6,228,678 | B1 | 5/2001 | Gilleo et al. |
| 6,294,837 | B1 | 9/2001 | Akram et al. |
| 6,313,531 | B1 | 11/2001 | Geusic et al. |
| 6,333,256 | B2 * | 12/2001 | Sandhu et al. .............. 438/623 |
| 6,420,210 | B2 | 7/2002 | Shen |
| 6,495,448 | B1 | 12/2002 | Lee |
| 6,569,604 | B1 | 5/2003 | Bhatt et al. |
| 6,596,644 | B1 | 7/2003 | Andrews et al. |
| 6,620,731 | B1 | 9/2003 | Farnworth et al. |
| 6,631,558 | B2 * | 10/2003 | Burgess ....................... 29/852 |
| 6,634,543 | B2 | 10/2003 | Curcio et al. |
| 6,696,008 | B2 | 2/2004 | Brandinger |
| 6,924,171 | B2 | 8/2005 | Buchwalter et al. |
| 6,982,191 | B2 | 1/2006 | Larson |
| 7,364,985 | B2 * | 4/2008 | Kirby .......................... 438/463 |
| 2002/0109228 | A1 * | 8/2002 | Buchwalter et al. ......... 257/738 |
| 2004/0197955 | A1 * | 10/2004 | Lee ............................. 438/108 |
| 2005/0032347 | A1 | 2/2005 | Hase et al. |
| 2005/0070092 | A1 | 3/2005 | Kirby |

* cited by examiner

US 7,629,250 B2

METHOD FOR CREATING ELECTRICALLY CONDUCTIVE ELEMENTS FOR SEMICONDUCTOR DEVICE STRUCTURES USING LASER ABLATION PROCESSES AND METHODS OF FABRICATING SEMICONDUCTOR DEVICE ASSEMBLIES

CROSS-REFERENCE TO RELATED APPLICATION

This application is a continuation of application Ser. No. 10/933,197, filed Sep. 1, 2004, now U.S. Pat. No. 7,575,999, issued Aug. 18, 2009.

BACKGROUND OF THE INVENTION

1. Field of the Invention

The present invention relates generally to the fabrication of semiconductor device structures. More particularly, the present invention relates to a method for creating depressions in a semiconductor substrate or film using laser ablation processes and using such depressions for defining precise electrically conductive elements along selected pathways in a semiconductor device structure, as well as related methods of fabricating semiconductor device assemblies.

2. Background of the Related Art

Connection lines (e.g., lead and/or bond connections), traces, signals and other elongated conductive elements are utilized in semiconductor device structures to carry electronic signals and other forms of electron flow between one region of the semiconductor device structure and another region thereof and between regions within the semiconductor device structure and external contacts (e.g., solder balls, bond pads and the like) associated therewith. Conventional methods for forming such elongated conductive elements may utilize a damascene process wherein one or more depressions are etched in an exposed surface of a semiconductor substrate or film, backfilled with an electrically conductive material, and polished back or "planarized" to be even (i.e., substantially coplanar) with respect to the exposed surface of the substrate or film.

As used herein, the term "depression" includes troughs, channels, vias, holes and other depressions in or through a material layer formed upon a semiconductor substrate. For instance, depressions may be used to define electrically conductive pathways that carry electronic signals between one region of a semiconductor device structure and another region thereof, and between regions within the semiconductor device structure and external contacts associated therewith, as well as providing power, ground, and bias to integrated circuitry of the semiconductor device structure. Such electrically conductive pathways may include, without limitation, depressions used to define traces or lines for signal lines, power and ground lines, and the like.

FIGS. 1A-1E schematically depict a conventional damascene process sequence for creating elongated conductive elements in the form of traces 26 in an interlevel dielectric layer 14. It will be understood by those of ordinary skill in the art that, while the process depicted illustrates formation of a plurality of generic conductive traces 26, such traces may be typically utilized for signal lines, power lines and ground lines, etc.

Referring to FIG. 1A, a cross-sectional view of a first intermediate structure 10 in the fabrication of a semiconductor device structure 24 having a plurality of traces 26 in the interlevel dielectric layer 14 thereof is illustrated. The first intermediate structure 10 includes an interlevel dielectric layer 14, e.g., thermally grown silicon dioxide ($SiO_2$), which resides on a semiconductor substrate 12, such as a silicon wafer. It will be understood by those of ordinary skill in the art that the figures presented in conjunction with this description are not meant to be actual cross-sectional views of any particular portion of an actual semiconductor device, but are merely representations employed to more clearly and fully depict the conventional process sequence than would otherwise be possible. Elements common between the figures may maintain the same numeric designation.

A photoresist layer 16, comprising a conventional photoresist material, is disposed atop the interlevel dielectric layer 14 and one or more trace precursors in the form of trace depressions 18 are patterned in the photoresist layer 16 using conventional photolithography techniques comprising selective masking, exposure and development. The patterned trace depressions 18 may be of any shape or configuration including, but not limited to, circles, ovals, rectangles, elongated slots and the like.

As shown in FIG. 1B, the interlevel dielectric layer 14 is subsequently etched using the photoresist layer 16 as a mask so that the patterned trace depressions 18 are extended into the interlevel dielectric layer 14. Such etching processes are known to those of ordinary skill in the art and may include, without limitation, reactive ion etching (RIE) or an oxide etch. As shown in FIG. 1C, the photoresist layer 16 is subsequently removed by a conventional process, such as a wet-strip process, a tape lift-off technique, or combinations thereof, creating a second intermediate structure 20.

As shown in FIG. 1D, an electrically conductive material 22, (e.g., tungsten) is subsequently blanket deposited over the interlevel dielectric layer 14 such that the trace depressions 18 are filled therewith. The electrically conductive material 22 is then planarized using, e.g., a mechanical abrasion technique, such as chemical mechanical planarization (CMP), to isolate the electrically conductive material 22 in the trace depressions 18, as illustrated in FIG. 1E. Thus, a semiconductor device structure 24 including a plurality of traces 26 in the interlevel dielectric layer 14 thereof is fabricated.

For forming more complex electrically conductive pathways, for instance, those in which both an elongated conductive element (e.g., a trace) and one or more discrete, vertically extending conductive structures (e.g., vias, contacts) are to be defined in a single interlevel dielectric layer, a dual damascene process may be utilized. FIGS. 2A-2I illustrate a conventional dual damascene process sequence. Referring to FIG. 2A, a cross-sectional view of a first intermediate structure 10' in the fabrication of a semiconductor device structure 24' (FIG. 2I) having a plurality of traces 26' (FIG. 2I) and a plurality of conductor-filled vias 32 (FIG. 2I) in the interlevel dielectric layer 14' thereof is illustrated. The first intermediate structure 10' includes an interlevel dielectric layer 14', e.g., thermally grown $SiO_2$, which resides on a semiconductor substrate 12', such as a silicon wafer. A mask layer 28 having a plurality of trace precursors in the form of trace depressions 18' patterned therein, is disposed atop the interlevel dielectric layer 14'. The patterned trace depressions 18' may be of any shape or configuration including, but not limited to, circles, ovals, rectangles, elongated slots and the like.

As shown in FIG. 2B, a photoresist layer 16', formed from a conventional photoresist material, is subsequently deposited atop the mask layer 28 such that the patterned trace depressions 18' are filled therewith. Next, as shown in FIG. 2C, conventional photolithography in the form of selective masking, exposure and development of photoresist layer 16' is performed on the photoresist layer 16' to form a patterned photoresist layer 16" having a plurality of vias 30 patterned therein which align with the trace depressions 18' of the mask layer 28.

Referring to FIG. 2D, the interlevel dielectric layer 14' is subsequently etched (e.g., by way of RIE) through the patterned photoresist layer 16". The pattern of vias 30 is accordingly extended into the upper portion of the interlevel dielectric layer 14'.

As shown in FIG. 2E, the patterned photoresist layer 16" is subsequently removed, forming a second intermediate structure 20'. Thereafter, the interlevel dielectric layer 14' is etched using the mask layer 28 with the patterned trace depressions 18' therein and the upper portion of the interlevel dielectric layer 14' with the vias 30 therein as a mask. The result is shown in FIG. 2F, wherein the desired trace pattern is extended into the upper portion of the interlevel dielectric layer 14' and the vias 30 in the upper portion of the interlevel dielectric layer 14' are concurrently extended into the lower portion of the interlevel dielectric layer 14'.

Subsequently, as shown in FIG. 2G, the mask layer 28 is removed by a conventional process to create a third intermediate structure 34. An electrically conductive material 22', e.g., tungsten, is then blanket deposited over the interlevel dielectric layer 14' such that the trace depressions 18' and vias 30 are filled therewith, as shown in FIG. 2H. The electrically conductive material 22' is then planarized using, e.g., a mechanical abrasion technique such as chemical mechanical planarization (CMP), to isolate the electrically conductive material 22' in the vias 30 and trace depressions 18'. The result of planarization is illustrated in FIG. 2I. Thus, a semiconductor device structure 24' having a plurality of traces 26' and a plurality of conductor-filled vias 32 defined in a single interlevel dielectric layer 14' thereof is fabricated.

Further methods of forming damascene and dual damascene structures are known. For instance, U.S. Pat. No. 6,495,448 describes an additional process for forming a dual damascene structure. However, all such conventional methods include one or more photolithography processing acts which significantly impact the cost of manufacturing semiconductor device structures. Further, elongated conductive elements, such as traces, and discrete conductive structures, such as vias, contacts or bond pads, must be created during separate and distinct processing acts, again increasing the cost and complexity of manufacture.

Accordingly, a method of forming elongated conductive elements and discrete conductive structures in a semiconductor substrate or film that utilizes fewer process acts than conventional processing techniques, uses less material than conventional processing techniques, or may be performed more quickly or more efficiently than conventional processing techniques would be desirable.

U.S. Pat. No. 6,107,109 to Akram discloses a method for fabricating a straight line electrical path from a conductive layer within a semiconductor device to the backside of a semiconductor substrate using a laser beam is disclosed. The method includes forming an opening through a substrate to electrically connect external contacts engaged on a face side thereof to the back side of the substrate. The opening is perpendicular to both the face side and back side of the substrate. In one embodiment, the openings are formed using a laser ablation process.

U.S. Pat. No. 6,114,240 discloses a method for laser ablation to form conductive vias for interconnecting contacts (e.g., solder balls, bond pads and the like) on semiconductor components. In the described method, a laser beam is focused to produce vias having a desired geometry, e.g., hourglass, inwardly tapered, or outwardly tapered.

U.S. Pat. No. 6,696,008 to Brandinger discloses a maskless patterning apparatus which allows for laser beam ablation of one or more layers of material while not etching an underlying different material layer. The apparatus also performs a monitoring function during ablation to determine when to terminate the ablation process.

U.S. patent application Ser. No. 10/673,692 filed Sep. 29, 2003, now U.S. Pat. No. 7,364,985, issued Apr. 29, 2008, and entitled "METHOD FOR CREATING ELECTRICAL PATHWAYS FOR SEMICONDUCTOR DEVICE STRUCTURES USING LASER MACHINING PROCESSES," assigned to the assignee of the present invention and the disclosure of which is incorporated, in its entirety, by reference herein, discloses a method of laser ablating electrically conductive pathways in a semiconductor substrate or in a film disposed thereon.

Another aspect of conventional semiconductor device fabrication pertains to flip-chip assemblies, wherein a semiconductor die is attached by its active surface to a carrier substrate. Conventionally, a dielectric underfill material, generally an epoxy adhesive, is applied between a surface of an individual semiconductor die and a substrate to which it is (already) electrically attached (i.e., by solder balls, bumps, etc.). The underfill material flows, in liquid form, between the semiconductor die and the carrier substrate, securing and stabilizing the semiconductor die to the carrier substrate.

Conventional dispensing of underfill material may be accomplished via a heated dispensing needle. The dispensing needle is precisely positioned with respect to the semiconductor die and package, because the accuracy of such positioning may greatly affect the resulting performance of the chip. For example, if the dispensing needle is too far from the semiconductor die during dispensing, the space between the semiconductor die and the substrate may not be adequately filled with the underfill material, leading to air voids that can affect performance of the semiconductor die in terms of shorting and environmental degradation. In addition, the dispensing rate and viscosity of the underfill material may be important as affecting uniform filling.

In view of the foregoing, a laser ablation processing technique which may be used for the formation of elongated conductive elements, e.g., traces and the like, in a film, such as a dielectric film on the surface of a semiconductor device or a wafer or other bulk substrate on which a plurality of semiconductor devices are fabricated, would be advantageous. Further, a technique wherein a plurality of different elongated conductive elements and discrete conductive structures may be defined in a single layer (e.g., a film) substantially simultaneously would be desirable. In addition, improved methods for providing an underfill structure for a semiconductor die attached to a carrier substrate would be beneficial.

BRIEF SUMMARY OF THE INVENTION

The present invention, in one embodiment, relates to a method for forming at least one conductive element in a dielectric layer formed upon a semiconductor substrate. Particularly, such a method may include providing a semiconductor substrate having a surface and forming a plurality of semiconductor dice on the surface of the semiconductor substrate. Further, a dielectric layer may be formed over the plurality of semiconductor dice on the surface of the semiconductor substrate. At least one depression may be laser ablated in the dielectric layer and an electrically conductive material may be deposited at least partially into the at least one depression.

Another aspect of the present invention relates to a method for assembling a semiconductor die to a carrier substrate. More specifically, a semiconductor die may be provided having an active surface and a plurality of bond pads thereon. Also, a carrier substrate may be provided having a plurality of terminal pads on a surface thereof. An underfill or other dielectric layer may be formed over the plurality of bond pads of the semiconductor die and at least one depression may be laser ablated substantially through the dielectric layer for electrically accessing at least one of the plurality of bond pads of the semiconductor die. Further, a conductive material may be deposited at least partially into the at least one depression and the at least one depression of the semiconductor die may be positioned proximate to a respective at least one of the plurality of terminal pads of the carrier substrate so as to effect electrical communication therebetween.

A further aspect of the present invention relates to a method for assembling a semiconductor die to a carrier substrate. Namely, a semiconductor die may be provided having an active surface and a plurality of bond pads thereon and a carrier substrate may be provided having a plurality of terminal pads on a surface thereof. Also, an underfill or other dielectric layer may be formed over the plurality of bond pads of the semiconductor die and at least one depression may be laser ablated substantially through the dielectric layer for electrically accessing at least one of the plurality of bond pads of the semiconductor die. A conductive material may be deposited at least partially into the at least one depression. Also, the at least one depression of the semiconductor die may be positioned proximate to a respective at least one of the plurality of terminal pads of the carrier substrate so as to enable electrical communication therebetween and the semiconductor die may be affixed to the carrier substrate. At least one of the dielectric layer and the conductive material may be at least partially melted to affix the semiconductor die to the carrier substrate. At least one of the dielectric layer and the conductive material may remain substantially solid during affixing the semiconductor die to the carrier substrate.

The methods of the present invention may be effected at the wafer or other bulk substrate level using a plurality of unsingulated semiconductor dice and, where applicable, a like plurality of unsingulated carrier substrates, followed by singulation of semiconductor dice with associated carrier substrates.

Other features and advantages of the present invention will become apparent to those of skill in the art through consideration of the ensuing description, the accompanying drawings, and the appended claims.

DETAILED DESCRIPTION OF THE INVENTION

Figure 1A:
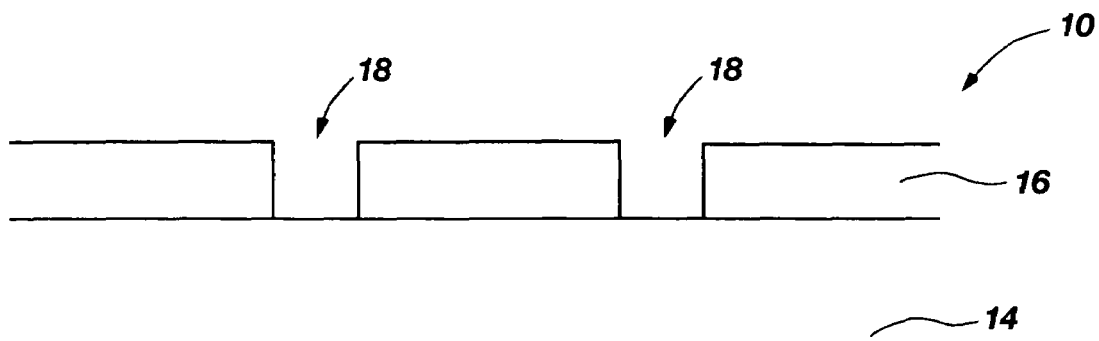
FIGS. 1A-1E are cross-sectional views schematically illustrating a conventional method of forming a damascene structure.
Figure 1A:
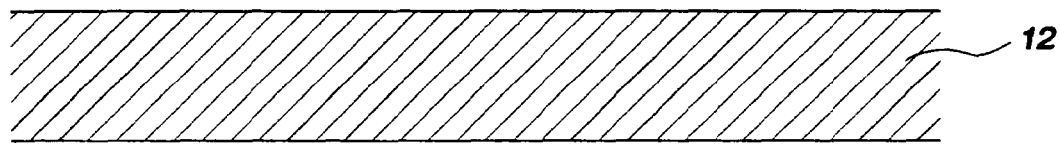
Figure 1B:
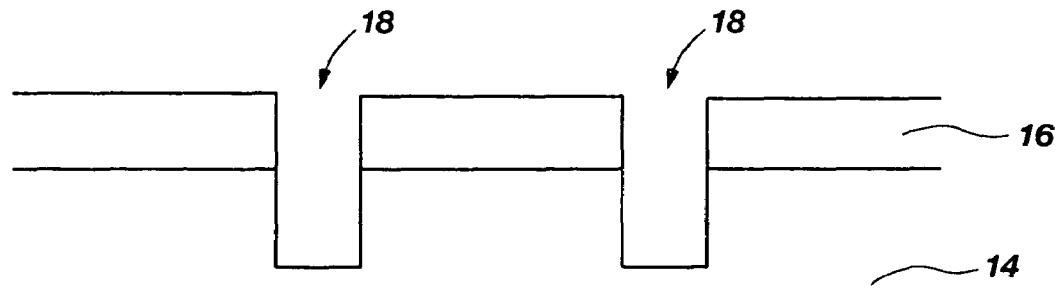
Figure 1B:
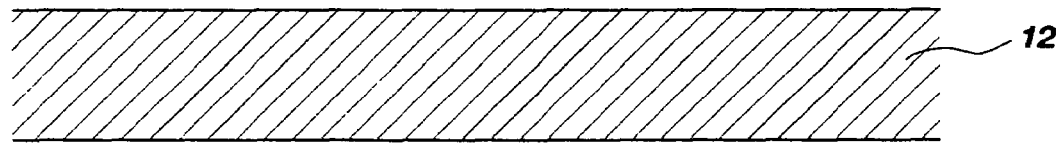
Figure 1C:
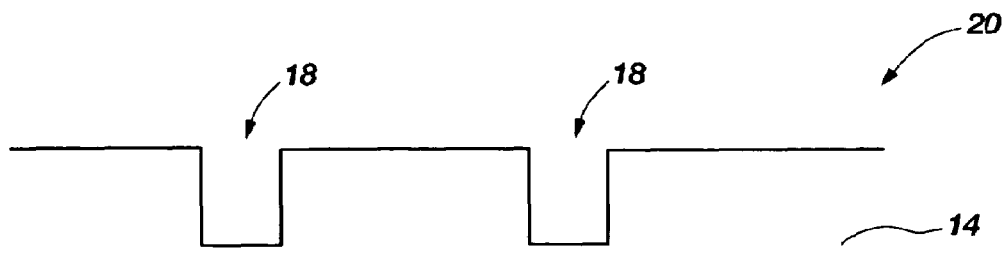
Figure 1D:
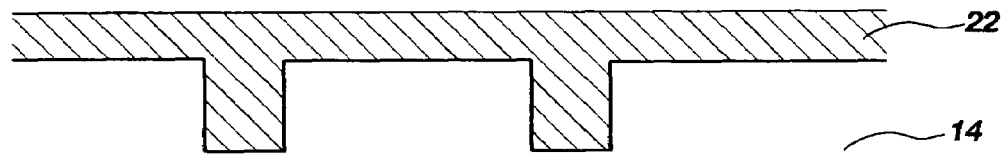
Figure 1E:
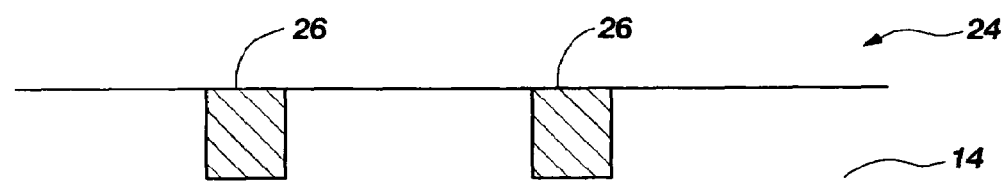
Figure 2A:
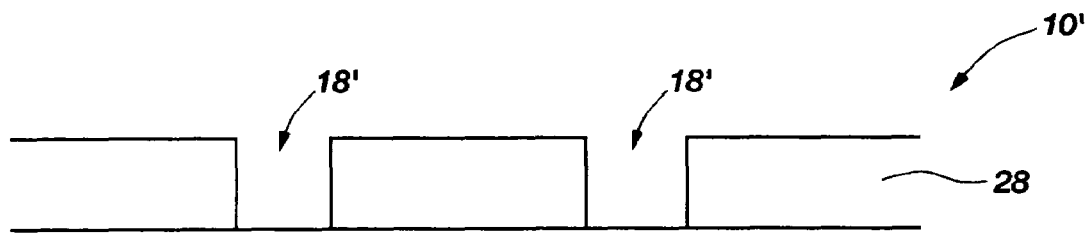
FIGS. 2A-2I are cross-sectional views schematically illustrating a conventional method of forming a dual damascene structure.
Figure 2A:
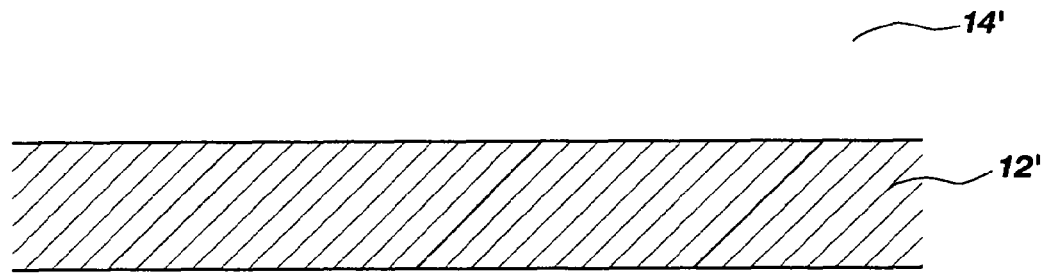
Figure 2B:
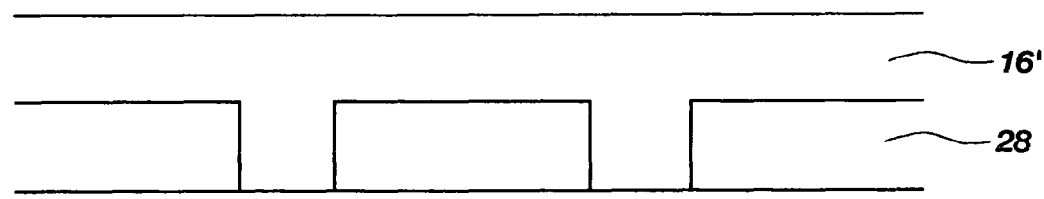
Figure 2B:
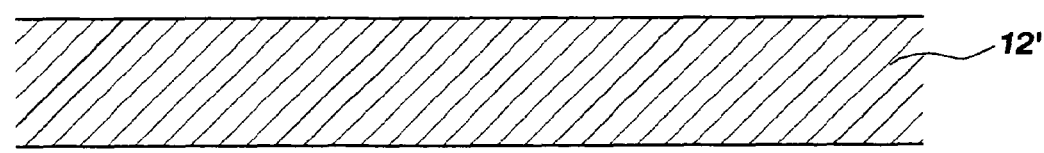
Figure 2C:
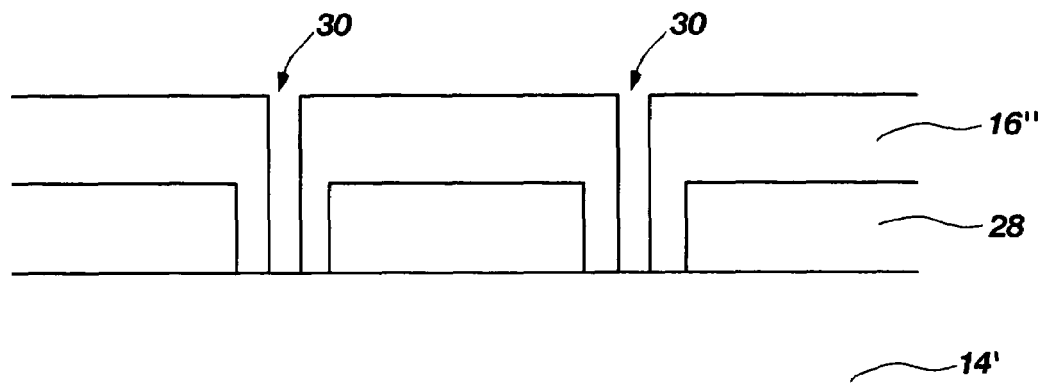
Figure 2D:
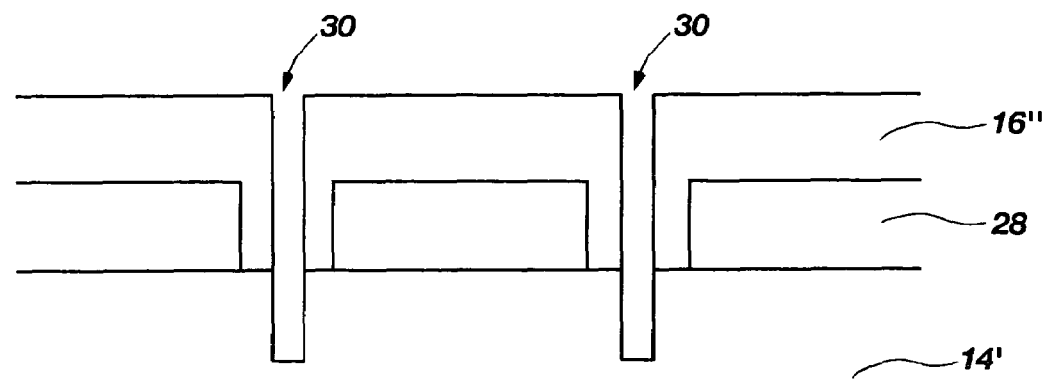
Figure 2E:
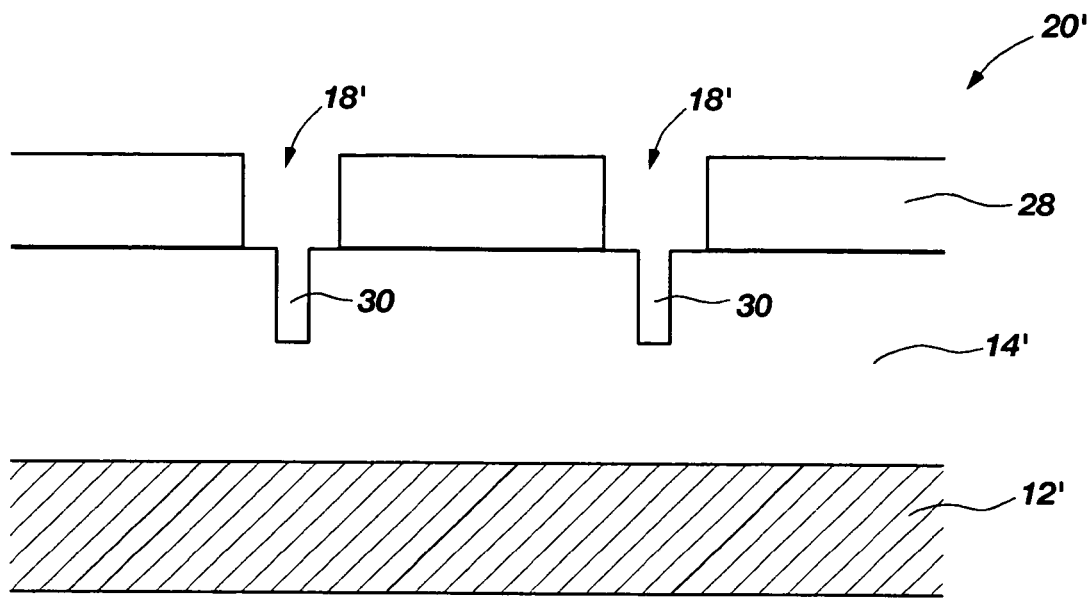
Figure 2F:
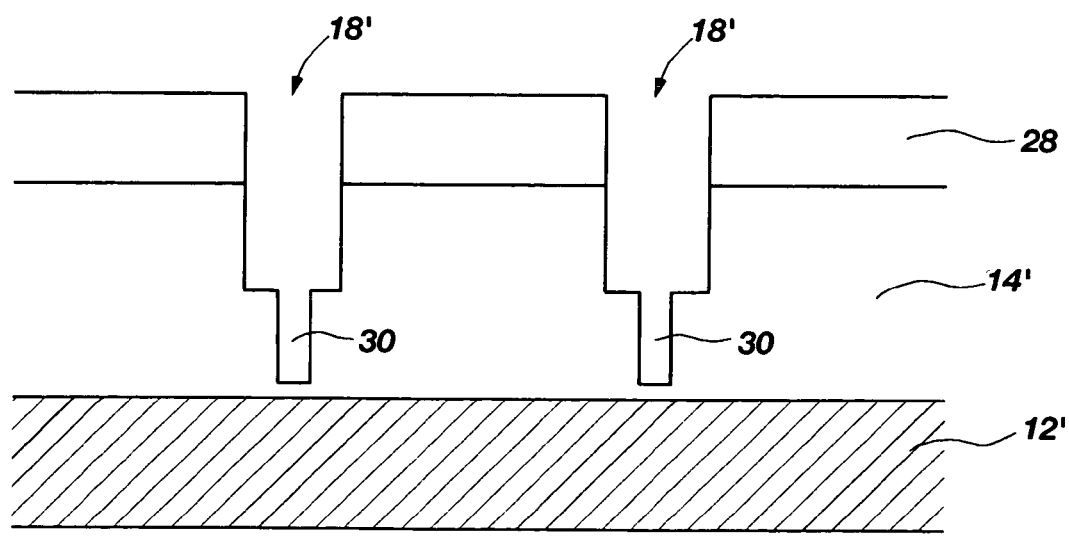
Figure 2G:
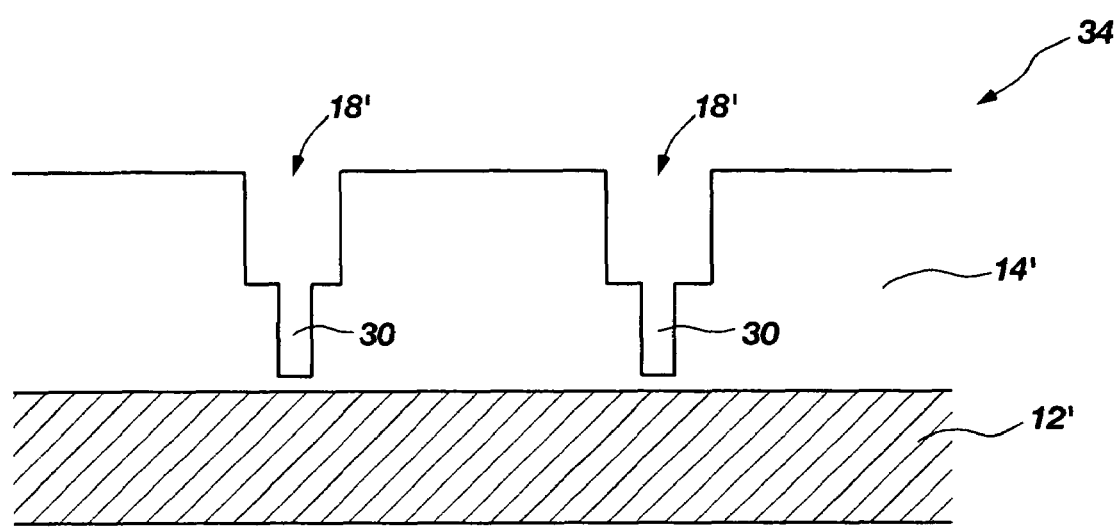
Figure 2H:
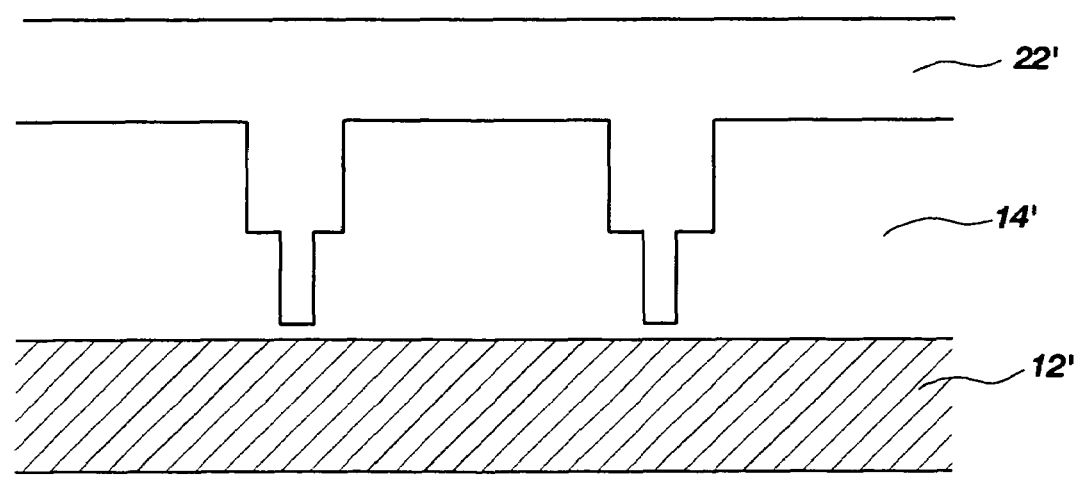
Figure 2I:
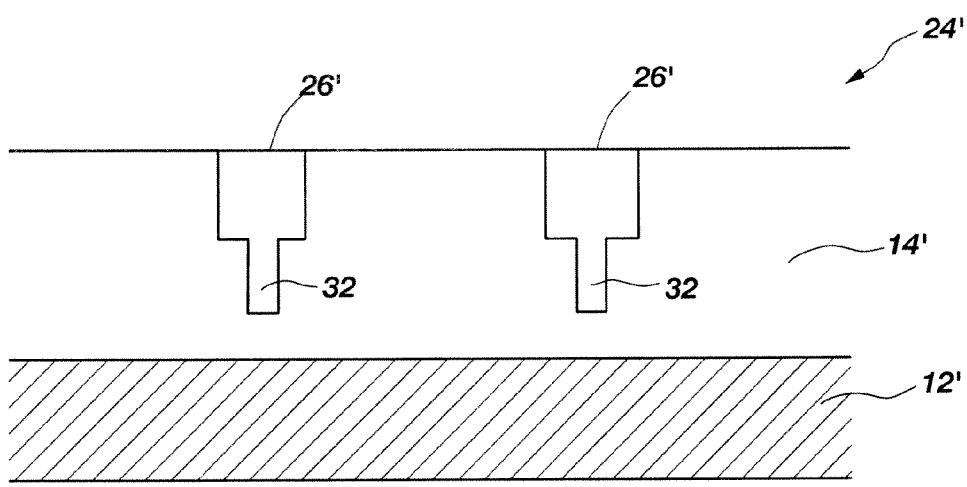

It should be understood that the figures presented in conjunction with this description are not meant to be actual cross-sectional views of any particular portion of an actual substrate or semiconductor device, but are merely representations employed to more clearly and fully depict the process of the invention than would otherwise be possible. Furthermore, the particular embodiments described hereinbelow are intended in all respects to be illustrative rather than limiting. Other and further embodiments will become apparent to those of ordinary skill in the art to which the present invention pertains without departing from its scope.

The present invention relates to a method for creating depressions in a dielectric layer or film formed on a surface of a semiconductor substrate using laser ablation processes. The depressions may define conductive traces or lines for signal lines, power and ground lines, and other elongated conductive elements utilized for defining electrical pathways in a semiconductor device. The method of the present invention may require fewer processing acts than conventional mask and etch techniques and may enable the creation of lines or traces substantially simultaneously with discrete conductive structures, such as vias, contacts or bond pads. Further, the process may offer a lower cost alternative to conventional damascene and dual damascene processes and may enable the formation of elongated conductive elements and discrete conductive structures of varying shapes to maximize use of the substrate or film. One exemplary application of the technology of the present invention is for creating electrically conductive elements along selected pathways to form a redistribution layer in wafer-level packaging.

FIGS. 3A-3F, 4, and 5A-5D illustrate various views of techniques according to the present invention for forming depressions in a film, which depressions define traces or lines for signal lines, power and ground lines, other elongated conductive elements or discrete conductive elements, such as bond pads, contacts or vias in semiconductor device structures. It should be understood and appreciated that the methods and structures of the present invention described herein do not encompass complete processes for manufacturing semiconductor device structures. Rather, the process acts and structures described herein pertain to facilitating an understanding of the methods of the present invention. Further, the omitted portions of the complete processes for fabricating semiconductor device structures are well known to those of ordinary skill in the art.

Referring to FIGS. 3A-3E, acts in an exemplary method according to the present invention for fabricating a semiconductor device structure 100 having elongated conductive elements in the form of a trace 102A and a via 102B in a dielectric layer 107 formed upon a semiconductor substrate 104 are illustrated.

It will be understood and appreciated by those of ordinary skill in the art that while the process depicted illustrates formation of a single trace 102A and a single via 102B, the process sequence illustrated may also be utilized for the formation of a plurality of elongated conductive elements or a plurality of discrete conductive elements as well. Put another way, generally, the present invention encompasses a method of forming at least one conductive element in a dielectric layer formed upon a semiconductor substrate. The at least one conductive element may comprise at least one elongated conductive element (e.g., a trace), at least one discrete conductive element (e.g., a via or bond pad), or combinations thereof, without limitation.

Figure 3A:
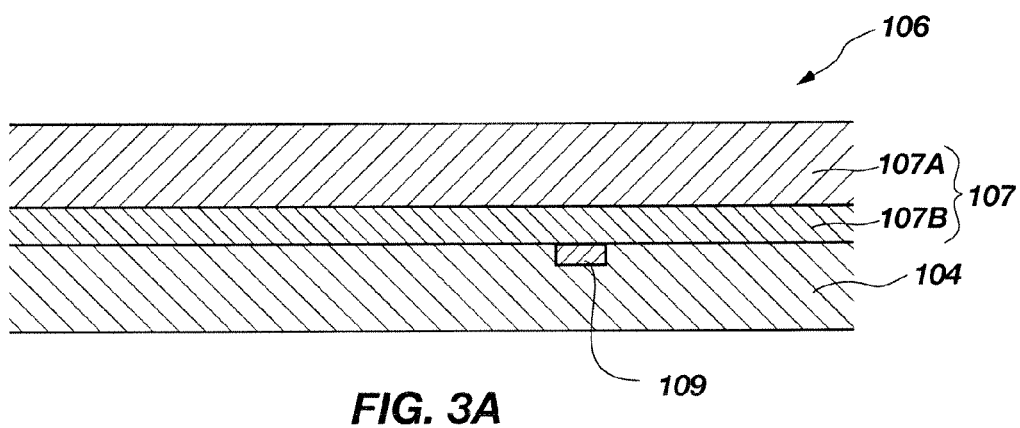
FIGS. 3A-3E are cross-sectional views schematically illustrating a method in accordance with the present invention for forming conductive elements (e.g., conductive traces or vias) in a dielectric layer disposed upon a semiconductor substrate (e.g., a silicon wafer)

With initial reference to FIG. 3A, a cross-sectional view of an intermediate structure 106 in the fabrication of a semiconductor device structure 100 (FIGS. 3E and 3F) is depicted. Intermediate structure 106 comprises a dielectric layer 107 formed upon a semiconductor substrate 104. As used herein, the term "semiconductor substrate" includes a semiconductor wafer or other substrate comprising a layer of semiconductor material, such as a silicon wafer, a silicon on insulator ("SOI") substrate such as a silicon on sapphire ("SOS") or a silicon on glass ("SOG") substrate, an epitaxial layer of silicon on a base semiconductor foundation, and other semiconductor materials including, but not limited to, silicon-germanium, germanium, gallium arsenide and indium phosphide.

Accordingly, a plurality of semiconductor dice may be formed on the surface of the semiconductor substrate and the dielectric layer may be formed over the plurality of semiconductor dice on the surface of the semiconductor substrate.

Generally, exemplary materials that may comprise dielectric layer 107 include, for example, a polymer, an oxide, a photopolymer, a thermoplastic, a glass, and a thermoset plastic. More specifically, for example, exemplary materials for comprising dielectric layer 107 may include, for example, a spin-on-glass (SOG), a thermal oxide, PARYLENE™ polymer, a low silane oxide (LSO), a pulse deposition layer comprising aluminum rich oxide, silicon dioxide, silicon nitride, silicon oxynitride, borophosphosilicate glass (BPSG), phosphosilicate glass (PSG), borosilicate glass (BSG), or any dielectric material having a low dielectric constant known in the art. Exemplary thermoplastics that may comprise dielectric layer 107 include, but are not limited to, polyester, polysulfone, polyetheretherketone, polyimide, polyarylene ether ketone, Vacrel, bisbenzocyclobutene, or polymethylmethacrylate (when cured). Further, adhesives such as epoxies, phenolics, acrylics, cyanoacrylates, and methacrylates may comprise dielectric layer 107. As known in the art, the dielectric layer 107 may be applied to a semiconductor substrate by, for example, spin coating, doctor blade coating, screen-printing, or film transfer techniques.

In one example, it may be desirable that dielectric layer 107 comprise a photopolymer applied to semiconductor substrate 104 in a flowable state for example, by spin-coating and curing, en masse, the entire layer of the photopolymer residing on semiconductor substrate 104 to form dielectric layer 107 in response to exposure to a UV light or heat. Put another way, curing of dielectric layer 107 to a substantially solid state may be effected substantially en masse or substantially as a whole subsequent to deposition thereof by broad-source UV light in a chamber, thermal cure in an oven, or combinations thereof. In this manner, dielectric layer 107 may be formed in a minimal amount of time. Alternatively, in another example, dielectric layer 107 may be formed upon a surface of semiconductor substrate 104 by a dry film process, as known in the art.

As shown in FIGS. 3A-3E, another layer of dielectric or insulating material 107B (such as silicon dioxide ($SiO_2$), silicon nitride ($Si_3N_4$), or PARYLENE™ polymer) may be optionally deposited or grown over the surface of the semiconductor substrate 104 prior to forming a dielectric layer 107A, if desired. Such a passivation layer may be formed over bond pads of semiconductor dice on a wafer and may be removed to expose the bond pads during the laser ablation process implemented in accordance with the present invention, eliminating a conventional etch step now employed to do so. The two layers of dielectric material 107A and 107B jointly form dielectric layer 107.

Figure 3B:
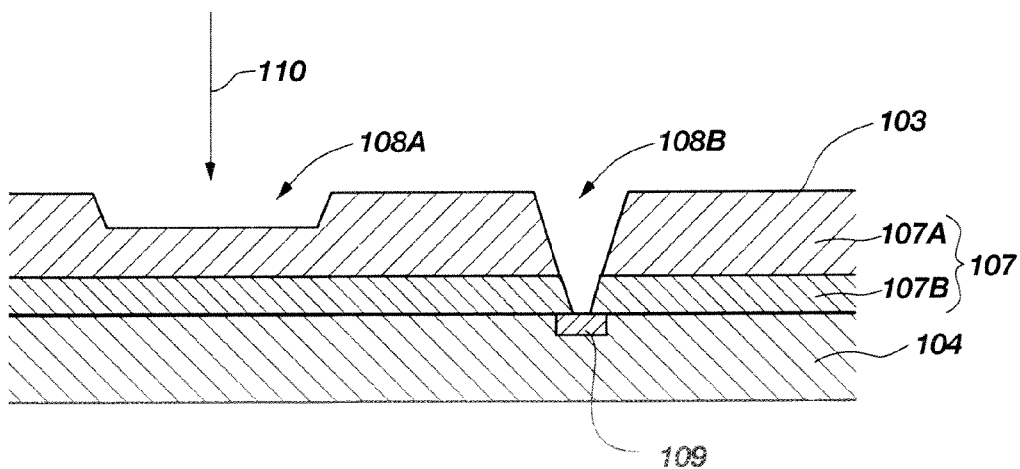

Further, a desired pattern of at least one conductive element precursor may be formed in the dielectric layer 107. Particularly, depressions 108A and 108B may be formed in dielectric layer 107 formed upon the semiconductor substrate 104 using a laser beam 110, as shown in FIG. 3B. In practice, one may place a semiconductor wafer, or other suitable semiconductor substrate 104, on a chuck or platen of a suitable laser ablation apparatus. The desired pattern of depressions 108A and 108B on semiconductor substrate 104 may be stored in a software program associated with the laser ablation apparatus such that upon activation thereof, the desired pattern may be ablated in the surface of the dielectric layer 107. In doing so, the laser beam 110 may rapidly traverse, substantially simultaneously, the surface of the dielectric layer 107, or may pause briefly in those locations where depressions 108A and 108B are desired and remain for a longer period of time at locations wherein relatively deeper depressions such as depression 108B are to be formed. In the presently preferred embodiment, the method of the present invention may be typically carried out at the wafer level.

Figure 4:
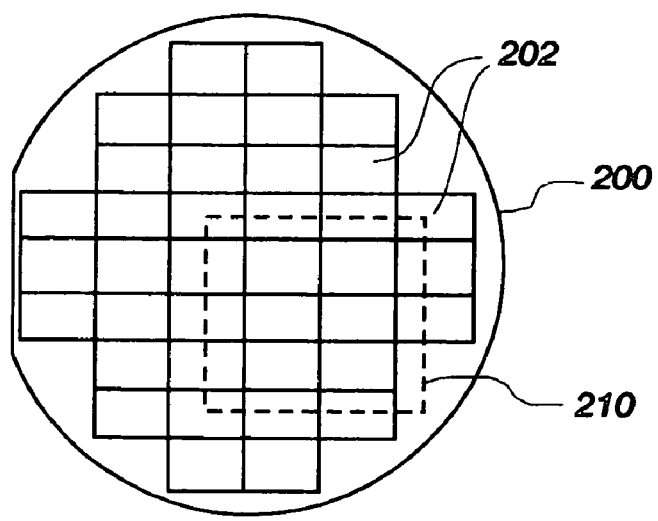
FIG. 4 is a top elevation view schematically illustrating a working field of a laser beam apparatus in accordance with the present invention for forming elongated conductive elements in a polymer layer formed upon a semiconductor substrate.

Explaining further, at the wafer level, a laser ablation apparatus may be configured with a "working field" (i.e., an area within which the laser may effectively ablate) which encompasses a plurality of semiconductor dice formed upon a semiconductor wafer. More specifically, FIG. 4 shows a semiconductor wafer 200 in a top elevation view including a plurality of semiconductor dice 202 formed thereon. Further, working field 210 is shown in FIG. 4 as a substantially square area of the semiconductor wafer 200 and encompasses a plurality of semiconductor dice 202. However, working field 210 may be shaped and sized according to the capabilities and constraints of the apparatus employed to generate, focus and aim the laser beam for laser ablation, without limitation.

Accordingly, at least one trace depression may be formed within a dielectric layer disposed over each of the plurality of semiconductor dice 202 within the working field 210 of the laser ablation apparatus substantially simultaneously. Such a method may increase throughput of a manufacturing process. Of course, the present invention contemplates that the size of the working field of the laser apparatus may be limited by the present state of the art optics and related technology and, therefore, will increase in the future as the optics and related technologies advance. However, it should be understood that the working field 210 and semiconductor dice 202 depicted in FIG. 4 are merely illustrative, and should not be construed as limiting.

Commercially available laser ablation apparatus for use in semiconductor device manufacturing may have a minimum width or footprint of a laser beam 110 of approximately 15 microns, or smaller. Accordingly, the technology of the present invention enables the formation of depressions 108A and 108B having a lateral dimension as small as approximately 15 microns, or smaller, and a shape suitable to define a desired pattern. For example, one suitable, commercially available, laser ablation apparatus, which comprises a 355 nm wavelength UV YAG laser, is Model No. 2700 manufactured by Electro Scientific Industries, Inc., of Portland, Ore. Another suitable, commercially available, laser ablation apparatus is manufactured by General Scanning of Sommerville, Mass. and is designated as Model No. 670-W. Yet another suitable, commercially available, laser ablation apparatus is manufactured by Synova S.A. of Lausanne, Switzerland.

Referring now to FIG. 3B, a representative laser fluence (i.e., quantity of incident radiation) of laser beam 110 for forming the depressions 108A and 108B within dielectric layer 107 may be from about 2 to about 10 watts/per unit area of the laser beam spot size and may have a pulse duration of between about 20-25 nanoseconds (NS), and a repetition rate of up to several thousand pulses per second. The wavelength of the laser beam 110 may be a known wavelength for forming a laser such as a UV wavelength (e.g., 355 nm), a green wavelength (e.g., 1064 nm-532 nm), or another wavelength, without limitation. By way of example, the width of the depressions 108A and 108B may be between about 15 microns to about 2 mils or greater.

It will be understood and appreciated by those of ordinary skill in the art and the present invention contemplates that the footprint of the laser beam 110 may be limited by the optics technology employed therewith and the wavelength of the light comprising the laser beam 110. Thus, as optical technology advances, the minimum footprint of the laser beam 110 may correspondingly become reduced in dimension, such that depressions 108A and 108B having increasingly smaller dimensions may be formed utilizing the technology of the present invention.

A laser ablation process of the present invention may be employed to form depressions 108A and 108B, which taper inwardly as the depth of the dielectric layer 107 increases. As shown in FIG. 3B, depression 108A may extend into the dielectric layer 107, from surface 103 thereof to a distance less than the thickness thereof or may extend through the full thickness of the dielectric layer 107. Depression 108B, similarly, may extend into the dielectric layer 107, from surface 103 thereof, through the full thickness of the dielectric layer 107 so as to expose at least a portion of a bond pad 109 formed on the active surface of the semiconductor substrate 104. Accordingly, each of trace depressions 108A and 108B may extend to a suitable distance into the dielectric layer 107 for forming a respective conductive element, such as a conductive trace or a conductive via.

Figure 3C:
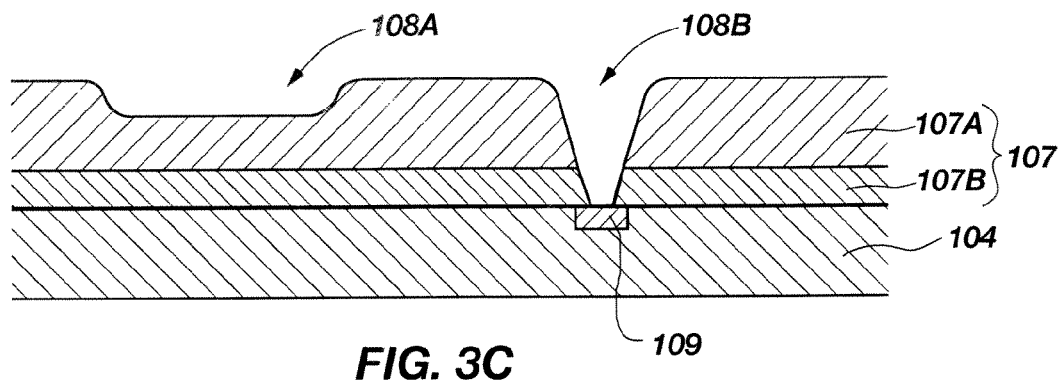

Optionally, subsequent to laser ablating depressions 108A and 108B and as shown in FIG. 3C, the dielectric layer 107 may be etched to clean the depressions 108A and 108B and to smooth the cross-sectional shape thereof. Etching in this manner may remove by-products of the laser ablation process as well as a so-called "heat-affected zone" (HAZ), which may extend within the remaining dielectric layer 107. In addition, etching may accentuate or alter the laser-ablated shape(s) of the depressions 108A and 108B.

Generally, the present invention contemplates that anisotropic and isotropic etching processes as known in the art may be employed, such as, for instance, wet etching and dry etching may be employed in implementing the present invention. More specifically, by way of example and not by limitation, plasma etching, magnetic ion etching, ion beam etching, reactive ion etching (RIE), ion beam milling, reactive ion beam etching, magnetically enhanced reactive ion etching, ion milling, electron cyclotron resonance, plasma enhanced reactive ion etching, chemical dry etching, chemical etching in a plasma, chemical-physical etching, or chemical wet etching may be employed for cleaning or further shaping of depressions 108A and 108B. Of course, the etching process and materials may be selected and tailored according to the material comprising dielectric layer 107 within which depressions 108A and 108B are formed.

In addition, dry etch techniques may exhibit etching in a substantially anisotropic fashion. This means that the dielectric layer 107 may be etched primarily in a substantially transverse or perpendicular direction relative to a planar surface (e.g., surface 103) thereof. Thus, such dry etch techniques may be capable of defining depressions or cavities with substantially vertical sidewalls and, therefore, may further define at least a portion of depressions 108A or 108B. Due to a trend in semiconductor fabrication processes toward decreased dimensions of structures on semiconductor devices, dry etching may be desirable for defining structures upon semiconductor devices.

Figure 3D:
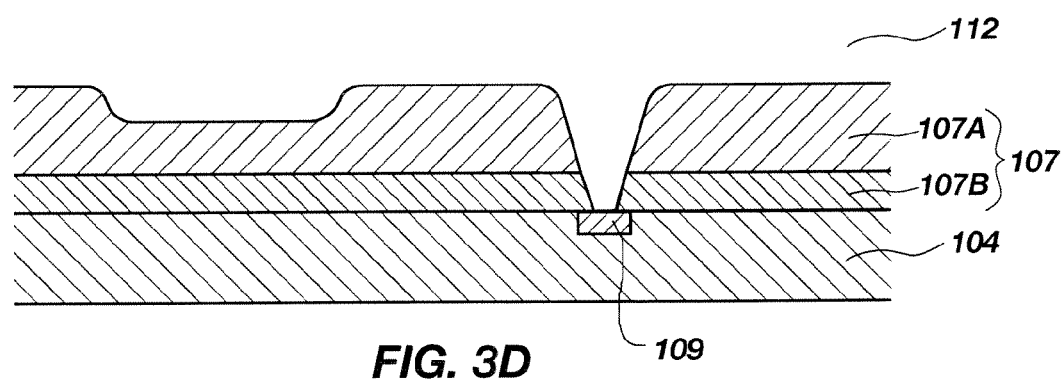

An electrically conductive material 112 may, subsequent to formation and optional cleaning of the depressions 108A and 108B, be blanket coated over the dielectric layer 107 using a suitable deposition process such that the depressions 108A and 108B are at least partially filled therewith, as shown in FIG. 3D. Suitable deposition processes may include, by way of example and not limitation, plating, soldering (e.g., wave soldering), atomized nanoparticle deposition, chemical vapor deposition (CVD), metallorganic chemical vapor deposition (MOCVD), plasma enhanced chemical vapor deposition (PECVD), physical vapor deposition (sputtering), and the like.

The electrically conductive material 112 may comprise a metal including, without limitation, aluminum, titanium, nickel, iridium, copper, gold, tin, tungsten, silver, platinum, palladium, tantalum, molybdenum, or an alloy of these metals. Solders, such as tin/lead solders and silver-containing solders, may be particularly useful in implementation of some embodiments of the present invention, as discussed in further detail below. Alternatively, the electrically conductive material 112 may comprise a conductive polymer, such as a metal-filled silicone, or a conductive or conductor-filled epoxy. Suitable conductive polymers are sold, for instance, by Epoxy Technology of Billerica, Mass. For example, Epoxy Technology commercially provides a conductive polymer designated "E3114-5." Further suitable conductive polymers include, without limitation, those sold by A.I. Technology of Trenton, N.J.; Sheldahl of Northfield, Minn.; and 3M of St. Paul, Minn. A conductive polymer may be deposited in the depressions 108A and 108B as a viscous material and subsequently cured as required and may be applied by a dispensing nozzle, squeegee (e.g., screen-printing), by spin-coating, or as otherwise known to those of ordinary skill in the art. In a further embodiment, the electrically conductive material 112 may comprise conductive nanoparticles in an organic carrier, which may be driven off by heating after deposition.

Alternatively, electrically conductive material 112 may be deposited within at least a portion of each of depressions 108A and 108B by way of so-called "maskless mesoscale materials deposition" (M3D). Such deposition may be selectively controlled, so that conductive material is deposited substantially within depressions 108A and 108B and not upon the entire surface of dielectric layer 107.

For instance, during a maskless mesoscale materials deposition, a material may be aerosolized by using an ultrasonic transducer or a pneumatic nebulizer. Then, the aerosol stream may be focused using a flow guidance deposition head, which forms an annular, coaxial flow between the aerosol stream and a sheath gas stream. Further, patterning may be accomplished by moving the substrate or deposition head relative to one another. The deposited electrically conductive material 112 may be subsequently heated to form a substantially dense electrically conductive material 112. For instance, the electrically conductive material 112 may be heated in an oven or by exposure to a laser beam. Commercially available maskless mesoscale materials deposition apparatus are produced by Optomec of Albuquerque, N. Mex.

Figure 3E:
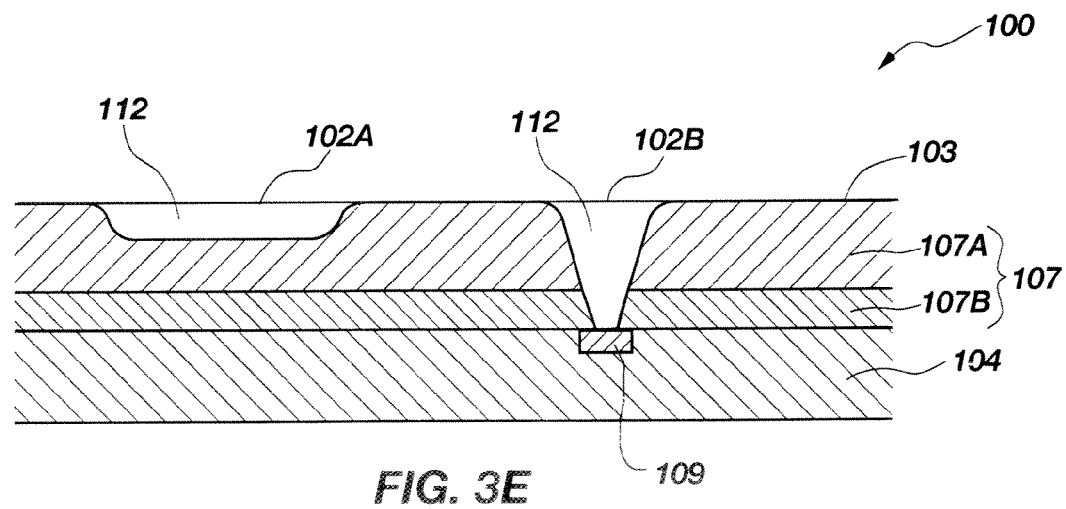

Next, as shown in FIG. 3E, if a blanket deposition of electrically conductive material 112 has been effected as depicted in FIG. 3D, the electrically conductive material 112 overlying surface 103 may be planarized using, e.g., a mechanical abrasion technique, such as chemical mechanical planarization (CMP), to electrically isolate the electrically conductive material 112 in each of depressions 108A and 108B from one another or from other electrically conductive elements.

Alternatively, if conductive material is deposited only substantially within each of the depressions 108A and 108B, or is otherwise suitably electrically isolated, such planarization may be unnecessary. For instance, if the depressions 108A and 108B are suitably sized in relation to the resolution and precision with which maskless mesoscale materials deposition may be performed, electrically conductive material 112 may be deposited selectively within at least a portion of each of depressions 108A and 108B. Not substantially filling depressions 108A and 108B may be preferred for avoiding the requirement for subsequent planarization of electrically conductive material 112 (e.g., making electrically conductive material 112 substantially coplanar in relation to surface 103). Of course, selective deposition processes as known in the art, such as plating through a mask may be utilized for depositing electrically conductive material 112 within at least a portion of each of the depressions 108A and 108B.

Figure 3F:
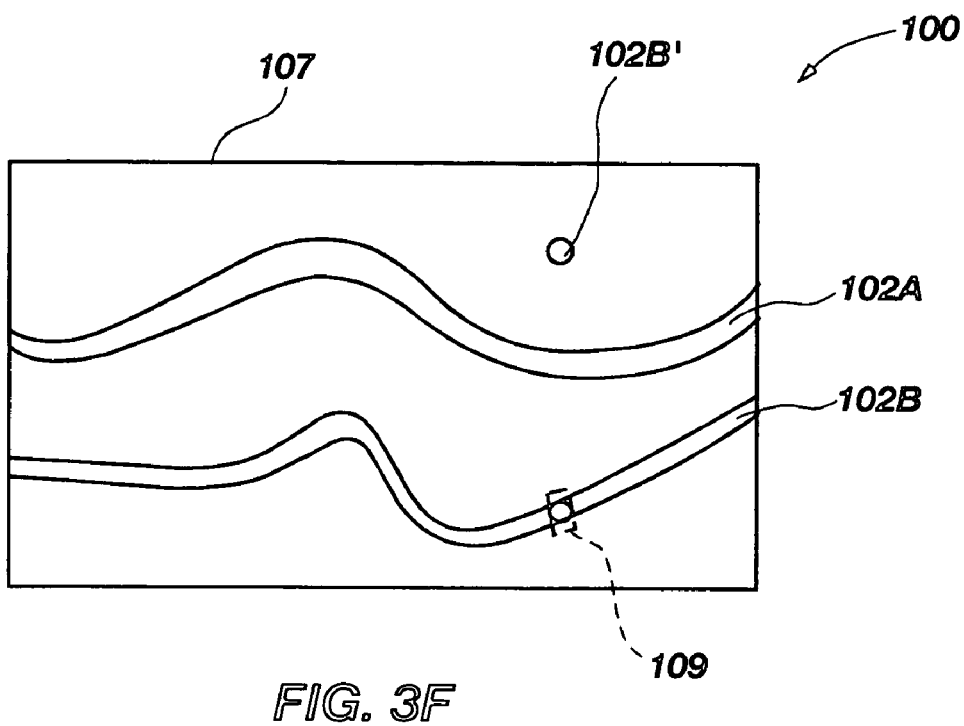
FIG. 3F is a top plan view of a semiconductor device having a plurality of filled elongated conductive elements in a semiconductor substrate thereof.

The above-described method may result in a semiconductor device structure 100 which includes conductive traces 102A and conductive via 102B in the dielectric layer 107 thereof, as shown in FIG. 3F. Thus, as shown in FIGS. 3E and 3F, conductive trace 102A may be configured as an elongated conductive trace while conductive via 102B may be configured as a combination of a conductive via (extending from bond pad 109) and an elongated conductive trace extending across the surface of semiconductor device structure 100. Of course, it should be appreciated that elongated conductive via 102B may be, alternatively, configured solely as a conductive via as shown in FIG. 3F in broken lines as 102B' or solely as an elongated conductive trace, without limitation.

Thus, methods of the present invention may be used to form depressions, such as troughs, channels, vias, or holes, which may be used to define electrical elements that carry electronic signals between one region of a semiconductor device structure and another region thereof, and between regions within the semiconductor device structure and external contacts associated therewith, or providing power, ground, and bias to integrated circuitry of the semiconductor device structure.

The method of the present invention may require substantially fewer processing acts than conventional mask and etch techniques and may offer a lower cost alternative in comparison to conventional processes. Further, the method of the present invention may enable the formation of elongated conductive elements of varying shapes, patterns, sizes and depths. Such flexibility may be useful for maximizing the available surface area, or "real estate," of the semiconductor device structure 100. Still further, the above-described method may provide a simple process for altering a desired electrical pattern, prior to ablation, as a new pattern merely must be programmed into the laser ablation apparatus. Thus, in contrast to conventional resist and etch processes, no new masks are required in accordance with the present invention when a new pattern is desired. Thus, a process according to the present invention may be easier and more convenient for modifying trace design than conventional mask and etch techniques.

It will be understood by those of ordinary skill in the art that this method of the present invention may be used to substantially simultaneously ablate a plurality of conductive elements (e.g., traces or vias) within a dielectric layer formed over a surface of a semiconductor structure. As used herein, the terms "substantially simultaneously" and "substantially concurrently" are interchangeable and are used to indicate a relatively rapid traversal of the laser beam over the surface of the desired dielectric layer.

In another aspect of the present invention, laser ablation may be used to form at least one depression which does not, initially, communicate with a bond pad formed on the semiconductor substrate. Rather, the depression defining at least one trace or via may be proximate to a bond pad so that subsequent etching exposes at least a portion of a bond pad of the semiconductor substrate. Such a method may reduce or prevent heat, debris, or other undesirable effects from the laser ablation process from influencing the bond pad. Accordingly, such a method may avoid deleterious effects, if any, of employing laser ablation to expose at least a portion of a bond pad.

Figure 5A:
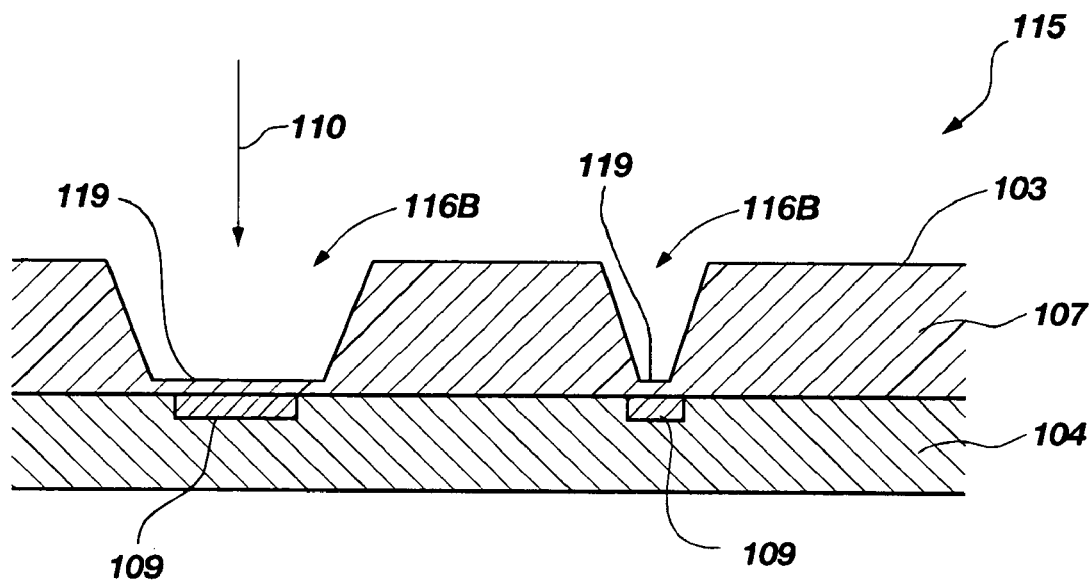
FIGS. 5A-5D are cross-sectional views schematically illustrating a method in accordance with the present invention for forming conductive elements (e.g., conductive traces or vias) in a dielectric layer disposed upon a semiconductor substrate semiconductor substrate.

In further detail, FIG. 5A shows an intermediate structure 115 including depressions 116B which are laser ablated to a degree so as to form surfaces 119 in dielectric layer 107 proximate to bond pads 109, respectively, of semiconductor substrate 104. Put another way, a relatively small depth of the dielectric layer 107 remains over the bond pads 109 subsequent to the laser ablation of depressions 116B.

Further, intermediate structure 115 as shown in FIG. 5A may be etched to expose at least a portion of each of bond pads 109, further shape depressions 116B, remove the HAZ, or combinations thereof. Any of the above-mentioned etching processes described, as described above.

Figure 5B:
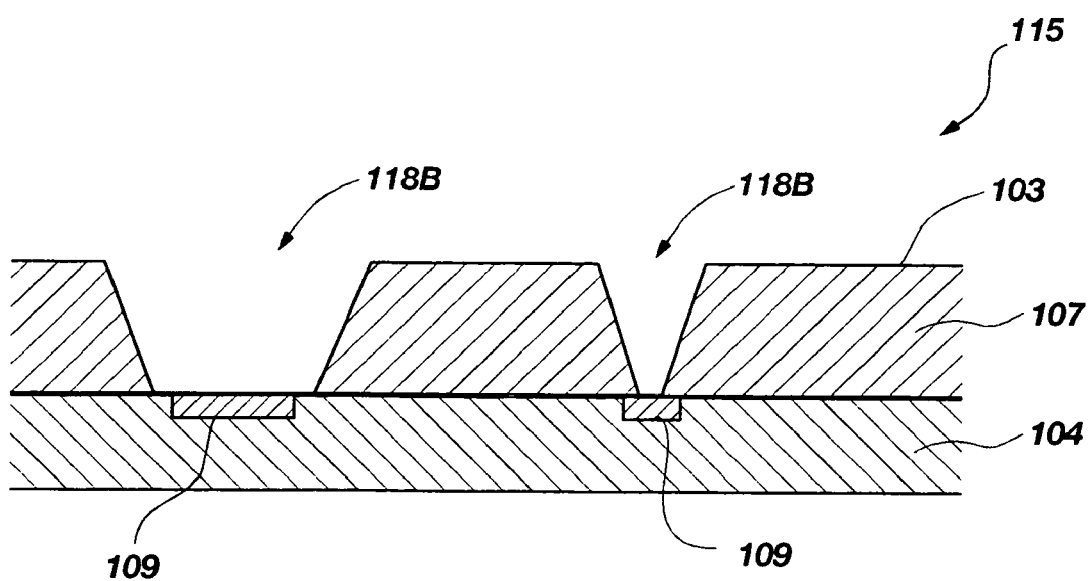

Thus, subsequent to etching the semiconductor substrate to form the structure shown in FIG. 5A, at least a portion of the thin depth of dielectric layer 107 remaining over the bond pads 109, may be removed, thus exposing at least a portion of each of the bond pads 109, respectively, and forming depressions 118B as shown in FIG. 5B. Further, an electrically conductive material 112, as described hereinabove, may subsequently be deposited such that depressions 118B are at least partially filled therewith, as shown in FIG. 5C.

For clarity, any of the above-described processes and materials pertaining to electrically conductive material 112 may be employed with respect to deposition of electrically conductive material 112 within depressions 118B. For instance, a conductive polymer or conductive nanoparticles may be deposited within depressions 118B. As a further alternative, a maskless mesoscale materials deposition process may be used to deposit conductive material within depressions 118B.

Figure 5C:
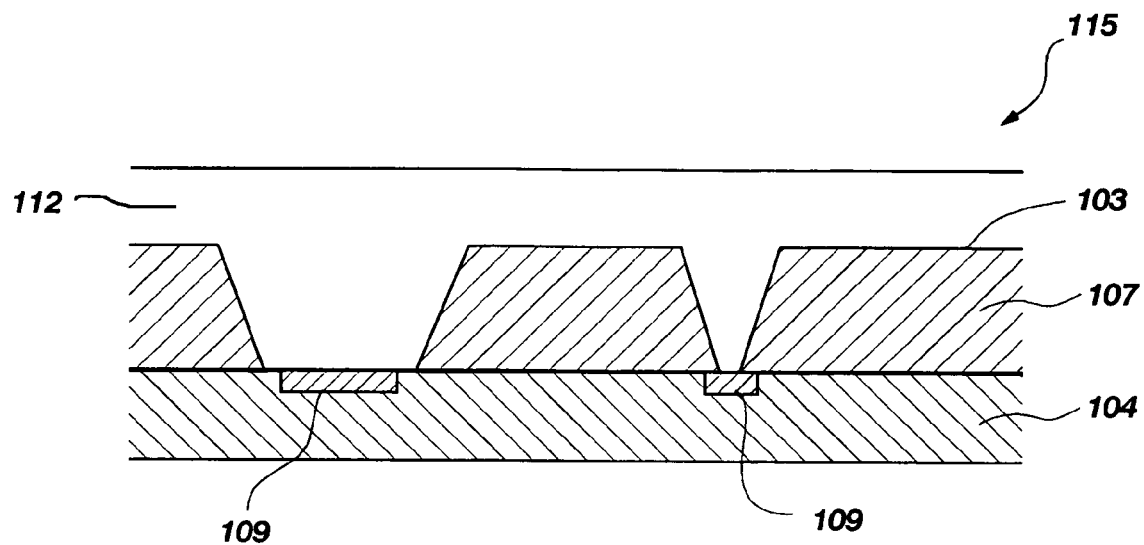
Figure 5D:
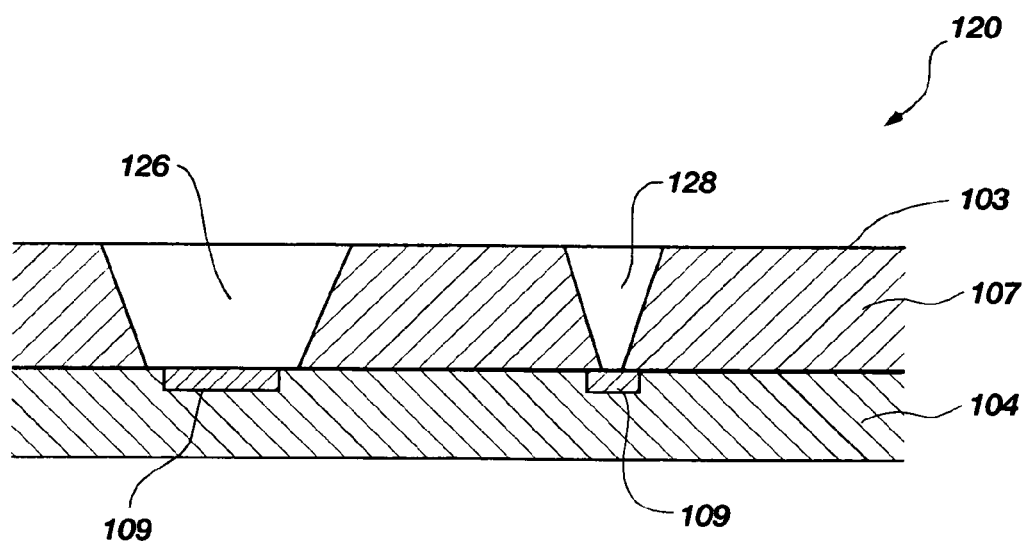

If required by the deposition process employed, the electrically conductive material 112 overlying the surface 103 of dielectric layer 107 as shown in FIG. 5C, may be planarized by employing, for instance, a mechanical abrasion technique, such as CMP, to electrically isolate the electrically conductive material 112 within the depressions 118B. Thus, as shown in FIG. 5D, a semiconductor device structure 120 including conductive elements 126 and 128 may be formed according to a method of the present invention.

The above-described method may substantially avoid damage to bond pads 109 associated with exposure thereof via laser ablation alone. Accordingly, such a method may be advantageous for providing electrical access to at least one bond pad 109 of a semiconductor substrate or a plurality of bond pads 109 of a semiconductor substrate 104, as shown in FIGS. 5A-5D.

In another aspect of the present invention, a flip-chip package may be fabricated utilizing a laser ablation process to form depressions in an underfill or other dielectric material formed over a plurality of bond pads of a semiconductor die.

Figure 6B:
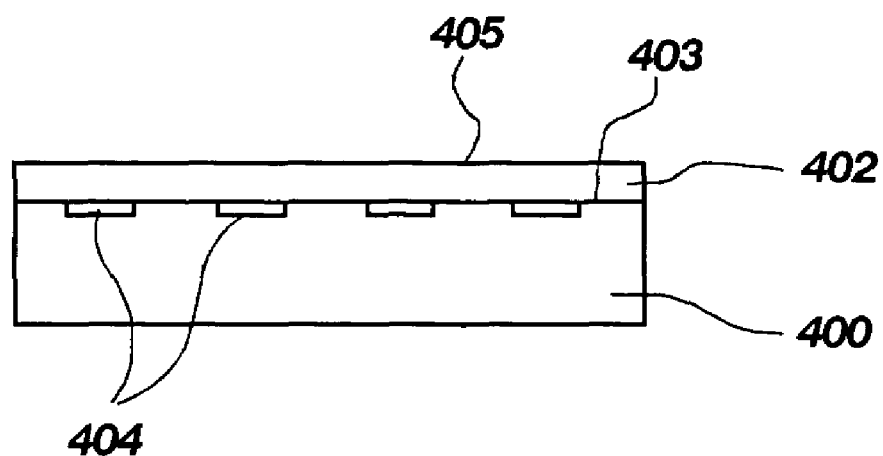
FIGS. 6B-6D are cross-sectional views schematically illustrating a method in accordance with the present invention for forming underfill structures by way of laser ablation in semiconductor substrate.
Figure 6A:
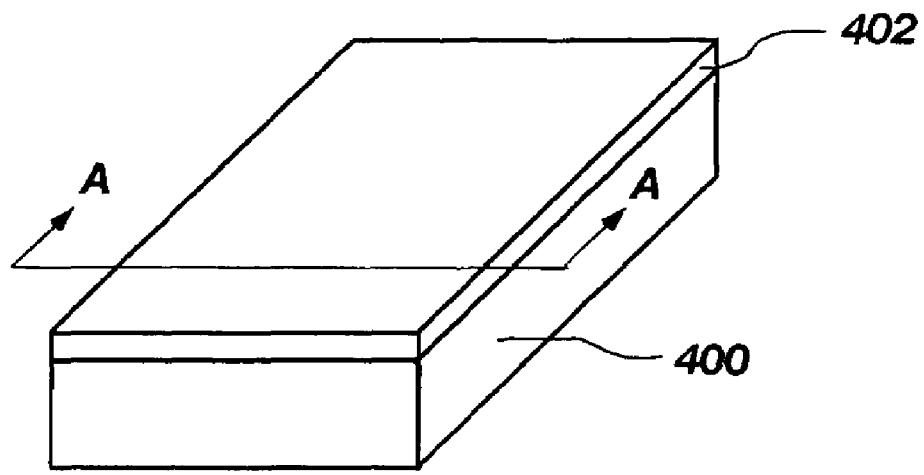
FIG. 6A is a perspective view of a semiconductor die including a blanket-coated underfill material deposited on the active surface thereof.

More particularly, as shown in FIGS. 6A and 6B, showing a perspective view of semiconductor die 400 and a side cross-sectional view thereof, respectively, a dielectric layer 402 may be formed upon an active surface 403 of a semiconductor die 400, covering the plurality of bond pads 404 thereof. Dielectric layer 402 may comprise, for instance, at least one of an epoxy resin with or without inert fillers, a polymer, a photopolymer, a thermoplastic, or a thermosetting resin. The dielectric layer 402 may be applied in flowable form or as a preformed, dry film. If dielectric layer 402 comprises a thermoplastic or thermosetting material applied in flowable form, it may be baked below its reflow or cure temperature to form a stable film.

Figure 6C:
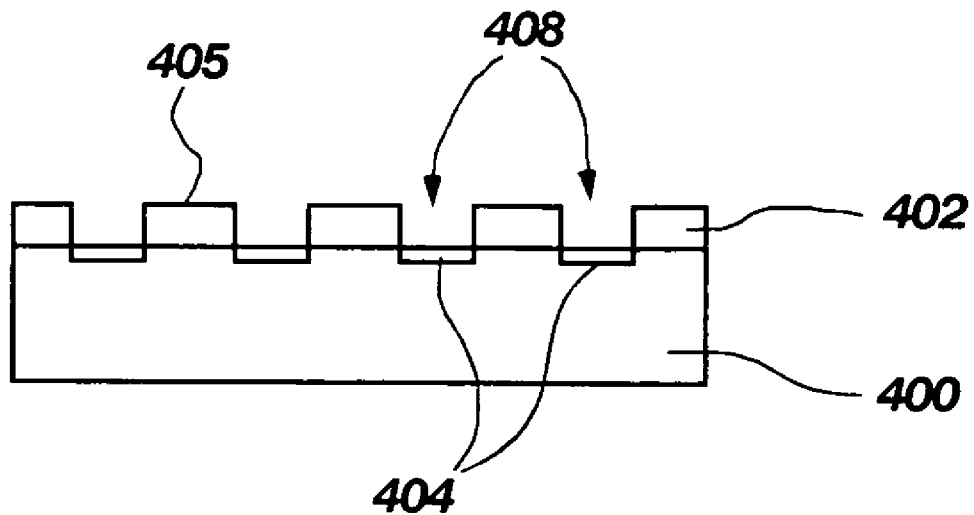

Further, as shown in FIG. 6C, a plurality of depressions 408 may be formed into surface 405 of dielectric layer 402 by laser ablation thereof, to expose (or nearly expose) at least a portion of each of bond pads 404, respectively. As described hereinabove with respect to FIGS. 3A-3E and FIGS. 5A-5D, laser ablation, etching, or combinations thereof may be employed to form depressions 408 for allowing, ultimately, electrical communication with a plurality of bond pads 404 of a semiconductor die 400, respectively. More specifically, in one example, laser ablation may expose at least a portion of each of bond pads 404 through dielectric layer 402 and, optionally, depressions 408 may be cleaned, as by use of an etchant, subsequent thereto. Alternatively, laser ablation may form initial depressions that extend proximate to each of bond pads 404 and a subsequent etching process may expose at least a portion thereof, respectively, as well as cleaning the depressions 408 of debris.

Figure 6D:
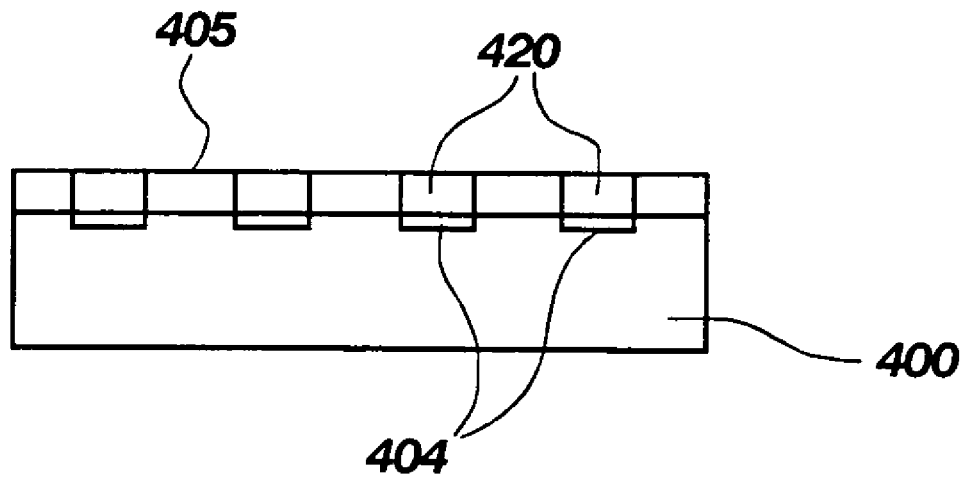

Further, each of the depressions 408 may be sized and configured for ultimately accepting a quantity of conductive material therein. As shown in FIG. 6D, electrically conductive material 420 may be deposited at least partially within each of the plurality of depressions 408 by a screen-printing process, by blanket deposition followed by planarization using one of the previously discussed deposition methods, by the use of ganged dispensing needles, or any other processes as known in the art for depositing a conductive material within each of the plurality of depressions 408. Further, if solder is to be used as electrically conductive material 420, preformed solder balls or pellets may be disposed in each of depressions 408, and then reflowed either prior to attachment of semiconductor die 400 to a carrier substrate as discussed in detail below to affix the solder to the semiconductor die 400, and then a second reflow conducted for attachment to the carrier substrate, or a single reflow conducted during the carrier substrate attach. Additionally, conductive material may be deposited in accordance with any of the above-described methods for depositing electrically conductive material 112.

For instance, explaining further, processes which move, push, spray, or force electrically conductive material 420 into each of depressions 408 may be utilized. In one example, a screen-printing process (with or without a stencil) may be performed for depositing electrically conductive material 420 (e.g., a conductive paste or ink) at least partially within the each of depressions 408 formed in the dielectric layer 402 according to the present invention.

Optionally, in combination with the above-described processes or other processes as known in the art for depositing electrically conductive material 420 within depressions 408, electrically conductive material 420 may be vibrated for promoting substantial and uniform filling of depressions 408 therewith, or for promoting the distribution (i.e., spreading) of paste substantially transverse to the direction of an earthly gravitational field. For instance, the present invention contemplates that vibration may be communicated to the electrically conductive material 420 by vibrating the semiconductor die 400, or as otherwise may be effective for causing at least partial filling of depressions 408 with electrically conductive material 420. Also, electrically conductive material 420 may be vibrated, such as by application of ultrasonic vibrational energy, during disposition thereof at least partially within depressions 408, thereafter, or both during and after deposition thereof at least partially within depressions 408.

Subsequent to depositing electrically conductive material 420 at least partially within depressions 408, a blade or another leveling apparatus may be employed to planarize or level the upper surface of the electrically conductive material 420 disposed within depressions 408. Put another way, the upper surface of electrically conductive material 420 may be leveled so as to exhibit an upper surface topography, which is substantially coplanar with respect to the surface 405 of dielectric layer 402. For instance, the electrically conductive material 420 may be planarized, if desirable (e.g., if electrically conductive material 420 extends beyond surface 405 of dielectric layer 402), by a mechanical abrasion technique, such as chemical mechanical planarization (CMP), or another planarization technique as known in the art.

Figure 7A:
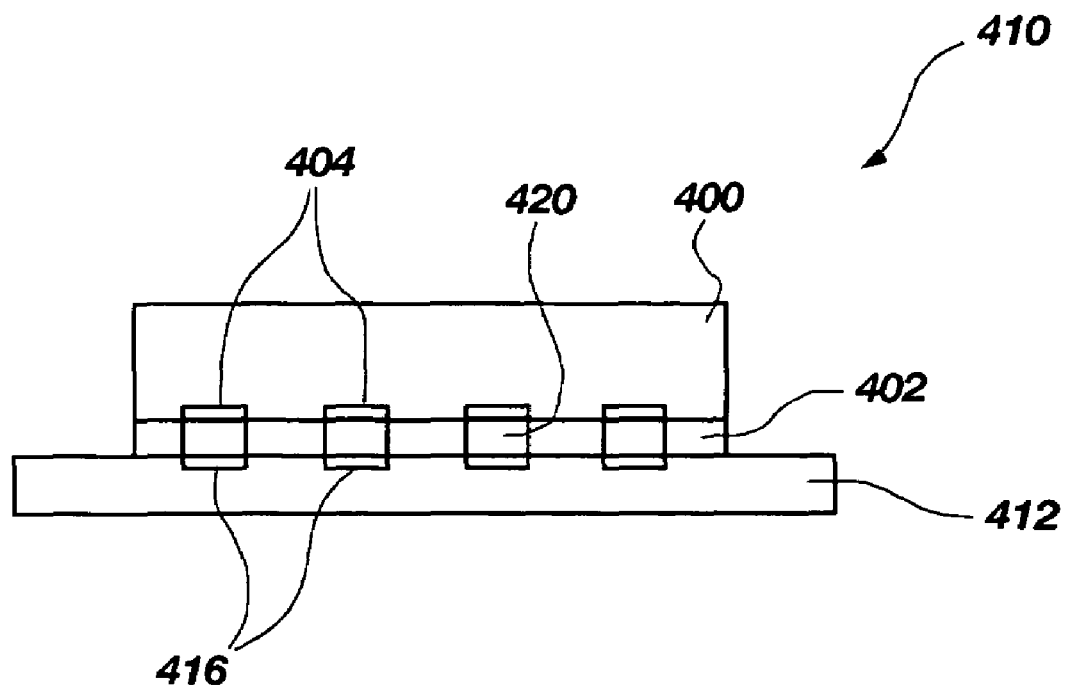
FIGS. 7A-7C are cross-sectional views schematically illustrating a method in accordance with the present invention for assembling a semiconductor die as shown in FIG. 6D to a carrier substrate.
Figure 7B:
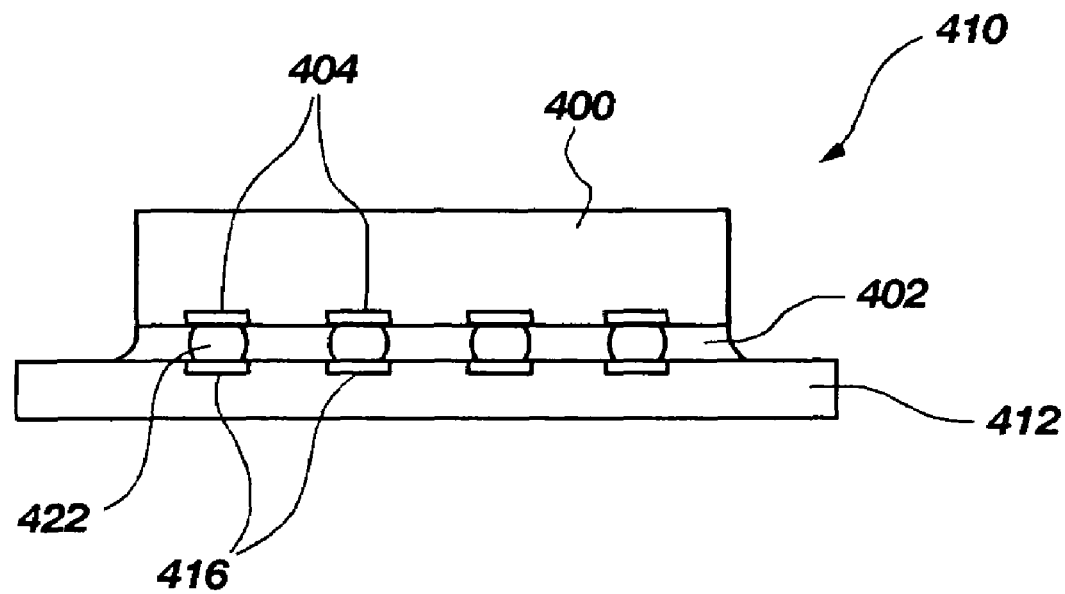
Figure 7C:
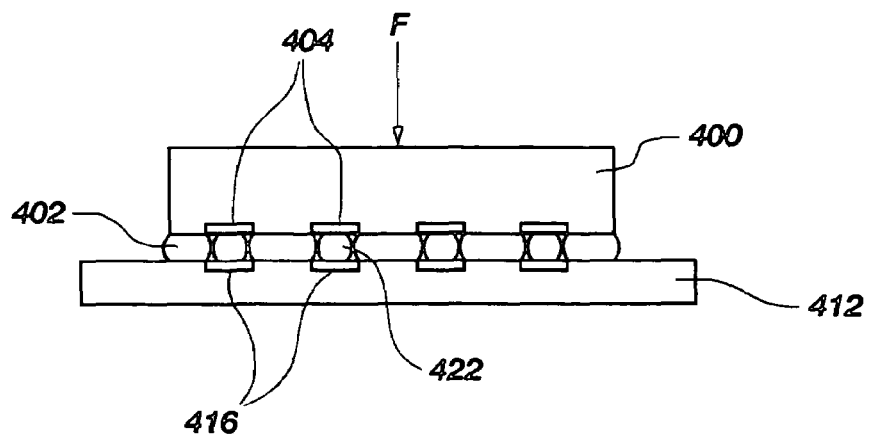
Figure 8:
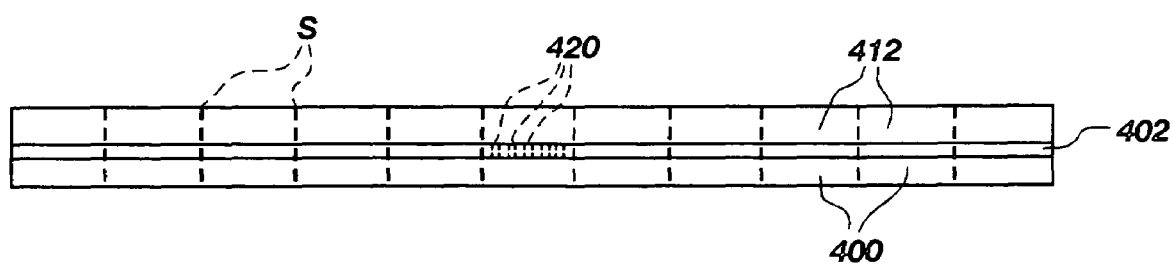
FIG. 8 schematically depicts a wafer-level assembly of a plurality of unsingulated semiconductor dice to a like plurality of unsingulated carrier substrates.

Also, the semiconductor die 400 may be assembled with a carrier substrate 412 so as to provide electrical communication therebetween, as shown in FIGS. 7A-7C. In further detail, the semiconductor die 400 may be positioned so that each of the depressions 408 thereof are positioned proximately and in alignment with each of the respective terminal pads 416 of the carrier substrate 412. It is further noted that the acts depicted in FIGS. 6A through 6D may, for economy, desirably be effected substantially simultaneously on a plurality of unsingulated dice comprising a portion of a larger semiconductor substrate such as a semiconductor wafer or other bulk substrate, and semiconductor dice 400 singulated thereafter. It should also be noted that carrier substrate 412 may comprise one of a plurality of unsingulated carrier substrates 412 of a like number and size to unsingulated semiconductor dice 400. Thus, assembly of semiconductor dice 400 with carrier substrates 412 may be effected at the wafer or other bulk substrate level, and singulation of semiconductor dice 400, each affixed and electrically connected to a carrier substrate 412, may be effected thereafter. Such an approach is depicted schematically in FIG. 8, prior to singulation along streets S between adjacent dice.

Conventionally, electrical and mechanical connection between a semiconductor die and a carrier substrate may be accomplished by affixing the bond pads of a semiconductor die to the terminal pads of a carrier substrate, then applying an underfill material between the semiconductor die and the carrier substrate. In contrast, according to the present invention, dielectric layer 402 is present prior to electrically and mechanically connecting the semiconductor die 400 to the carrier substrate 412. Therefore, certain advantages may be realized.

In one process according to the present invention, the dielectric layer 402 may at least partially melt during bonding of the semiconductor die 400 to the carrier substrate 412. Regarding an amorphous material, "melts," as used herein, denotes a state or condition of a material at a temperature exceeding its glass transition temperature. In another process according to the present invention, the dielectric layer 402 may retain a substantially solid state during bonding of the semiconductor die 400 to the carrier substrate 412. In a variation wherein the dielectric layer 402 remains substantially solid during bonding, it may become tacky nonetheless to adhere semiconductor die 400 to carrier substrate 412.

In one example of a process according to the present invention, as shown in FIG. 7A, the semiconductor die 400 (FIG. 6D) may be aligned with and assembled to a carrier substrate 412 to form a semiconductor device assembly 410. Where electrically conductive material 420 comprises a conductive paste, such as a solder paste, a reflow process, as known in the art, may be employed to melt electrically conductive material 420, which, upon solidifying, may affix and electrically connect the carrier substrate 412 to the semiconductor die 400 by forming conductive structures 422. Further, the temperature required to melt the electrically conductive material 420 may also melt or at least partially melt the dielectric layer 402. Thus, both electrically conductive material 420 and dielectric layer 402 may affix (upon solidification or curing) the semiconductor die 400 to the carrier substrate 412. Of course, depending on the properties of the electrically conductive material 420 and the dielectric layer 402, affixation of each may occur at different temperatures or under different conditions. Such a process may be advantageous in comparison to conventional underfill processes because very little air must be displaced by the dielectric layer 402 to substantially completely fill between the semiconductor die 400 and the carrier substrate 412.

Regarding another example of a process according to the present invention, as shown in FIG. 7A, the semiconductor die 400 and carrier substrate 412 may be aligned and assembled to one another. However, if the dielectric layer 402 may remain at least partially solid during bonding of the semiconductor die 400 to the carrier substrate 412, it may be preferable to bond (electrically and mechanically) the semiconductor die 400 to the carrier substrate 412 while the dielectric layer 402 is under compressive stress.

For instance, as shown in FIG. 7C force F may be applied to the semiconductor die 400 and carrier substrate 412 which compresses the dielectric layer 402 therebetween during bonding of the semiconductor die 400 to the carrier substrate 412 by melting or curing the electrically conductive material 420 within each of depressions 408 to form conductive structures 422. Such a process may provide a favorable environment for sealing the dielectric layer 402 to the semiconductor die 400. Further, dielectric layer 402 may comprise a resilient or flexible material. Thus, dielectric layer 402 may exhibit a first, uncompressed thickness and, under a force as described above, a second, compressed thickness which is less than the first, uncompressed thickness.

Of course, optionally, external forces may not be applied to the semiconductor device assembly 410 during affixation of the semiconductor die 400 to carrier substrate 412, so that substantially only the earthly force of gravity associated therewith may influence the semiconductor device assembly 410 during such affixation. In such a configuration, the dielectric layer 402 may provide a desired stand-off gap between the semiconductor die 400 and the carrier substrate 412.

The present invention also contemplates that the dielectric layer 402 may bond the semiconductor die 400 to the carrier substrate 412, while the electrically conductive material 420 may be substantially solid during such affixation. In further detail, for instance, electrically conductive material 420 may comprise a plated metal, such as copper, which may be planarized (or selectively deposited) to form a semiconductor die 400 including a dielectric layer 402 surrounding solid elements of electrically conductive material 420 as shown in FIG. 6D. Then, the semiconductor die 400 and carrier substrate 412 may be aligned and assembled to one another and heated to at least partially melt the dielectric layer 402. However, the electrically conductive material 420 may remain at least partially solid during bonding of the semiconductor die 400 to the carrier substrate 412, becoming merely tacky to provide an adhesive effect. Optionally, it may be preferable to force the semiconductor die 400 toward the carrier substrate 412 while the dielectric layer 402 at least partially melts. Such a configuration may provide a compressive stress state within the conductive structures 422 within the semiconductor device assembly 410. Thus, summarizing, the present invention contemplates flip-chip arrangements wherein at least one of the dielectric layer and the conductive material may remain substantially solid during affixing the semiconductor die to the carrier substrate 412.

Thus, it will be appreciated by those of ordinary skill in the art that the present invention eliminates process acts as employed in the state of the art, eliminates capital expenditures and materials for photolithography and dry etching, and produces a high quality, repeatable product that may be quickly and easily modified, as desired or required. In addition, wafer throughput is increased by elimination of photolithographic alignment and development requirements, and polymer pull-back issues as experienced in the state of the art photopolymers are eliminated, as (for example) a polyimide used for a dielectric layer in the present invention is cured prior to laser ablation.

The present invention has been described in relation to particular, exemplary embodiments that are intended in all respects to be illustrative rather than restrictive or limiting. It is to be understood that the invention defined by the appended claims is not to be limited by particular details set forth in the above description and that other embodiments and modifications to the exemplary embodiments will be readily apparent to those of ordinary skill in the art to which the present invention pertains without departing from the spirit and scope thereof.

What is claimed is:

1. A method for forming at least one conductive element in a dielectric layer formed upon a semiconductor substrate, comprising:
   providing a semiconductor substrate;
   forming a plurality of semiconductor dice on a surface of the semiconductor substrate;
   forming a first dielectric layer over the plurality of semiconductor dice on the surface of the semiconductor substrate;
   forming a second dielectric layer over the first dielectric layer;

ablating at least one elongate depression extending into but not through the second dielectric layer and at least one discrete depression extending through the second dielectric layer and into the first dielectric layer; and depositing an electrically conductive material at least partially into the at least one elongate depression and the at least one discrete depression.

2. The method of claim 1, wherein ablating at least one discrete depression extending through the second and into the first dielectric layer comprises laser ablating a surface of the first dielectric layer at least proximate to a surface of at least one bond pad of at least one semiconductor die of the plurality of semiconductor dice.

3. The method of claim 2, further comprising etching the first dielectric layer at least at a lower extent of the at least one discrete depression to expose at least a portion of the at least one bond pad.

4. The method of claim 1, wherein ablating the at least one discrete depression extending through the second dielectric layer and into the first dielectric layer comprises ablating a plurality of discrete depressions extending through the second dielectric layer and into the first dielectric layer.

5. The method of claim 1, wherein forming the first dielectric layer over the plurality of semiconductor dice on the surface of the semiconductor substrate comprises forming a first dielectric layer including at least one of a silicon dioxide, silicon nitride, or PARYLENE™ polymer.

6. The method of claim 1, wherein forming the second dielectric layer over the first dielectric layer comprises forming a second dielectric layer including at least one of a polymer, an oxide, a photopolymer, a thermoplastic, a glass, and a thermosetting plastic.

7. The method of claim 1, wherein depositing the electrically conductive material at least partially into the at least one elongate depression and the at least one discrete depression comprises depositing the electrically conductive material over a surface of the second dielectric layer and at least partially into the at least one elongate depression and the at least one discrete depression and further comprising planarizing the electrically conductive material at least to the surface of the second dielectric layer to electrically isolate the electrically conductive material at least partially within the at least one elongate depression and the at least one discrete depression.

8. The method of claim 7, further comprising etching the at least one discrete depression in the surface of the first dielectric layer to a greater depth subsequent to ablating and prior to depositing the electrically conductive material over the surface of the semiconductor substrate.

9. The method of claim 1, wherein ablating the at least one elongate depression comprises ablating at least one depression elongated to a length in a direction substantially parallel to a surface of the semiconductor substrate in and along the surface of the second dielectric layer, the length of the at least one depression being greater than a width of the at least one depression.

10. The method of claim 9, wherein ablating the at least one elongate depression further comprises ablating at least one discrete depression extending to a greater depth than the at least one elongated depression.

11. The method of claim 10, further comprising forming the at least one discrete depression through a portion of a bottom of the at least one elongated depression.

12. The method of claim 1, wherein ablating the at least one elongate depression comprises ablating at least one discrete depression through a portion of a bottom of the at least one elongate depression.

13. A method for forming at least one conductive element in a dielectric layer formed upon a semiconductor substrate, comprising:

providing a semiconductor substrate;

forming a plurality of semiconductor dice on a surface of the semiconductor substrate;

forming a first dielectric layer over the plurality of semiconductor dice on the surface of the semiconductor substrate;

forming a second dielectric layer over the first dielectric layer ablating at least one elongate depression extending into but not through the second dielectric layer and at least one discrete depression extending through a bottom of the at least one elongate depression through the second dielectric layer and into the first dielectric layer; and depositing an electrically conductive material at least partially into the at least one elongate depression and the at least one discrete depression.

14. The method of claim 13, wherein ablating the at least one discrete depression through the second dielectric layer and into the first dielectric layer comprises laser ablating a surface of the first dielectric layer at least proximate to a surface of at least one bond pad of at least one semiconductor die of the plurality of semiconductor dice.

15. The method of claim 14, further comprising ablating the at least one discrete depression extending through a bottom of the at least one elongate depression through the second dielectric layer and into the first dielectric layer to expose at least a portion of the at least one bond pad.

16. The method of claim 13, wherein ablating the at least one elongate depression comprises laser ablating a trench for at least one conductive element elongated to a length in a direction substantially parallel to a surface of the semiconductor substrate in and along the surface of the second dielectric layer, the length of the trench being greater than a width of the trench.

17. The method of claim 13, wherein depositing the electrically conductive material at least partially into the at least one elongate depression and the at least one discrete depression comprises depositing the electrically conductive material over a surface of the second dielectric layer and at least partially into the at least one elongate depression and the at least one discrete depression and further comprising planarizing the electrically conductive material at least to the surface of the second dielectric layer to electrically isolate the electrically conductive material at least partially within the at least one elongate depression and the at least one discrete depression.

18. The method of claim 17, further comprising etching at least one elongate depression of the plurality in the surface of the dielectric layer to a greater depth subsequent to ablating and prior to depositing the electrically conductive material over the surface of the semiconductor substrate.

19. The method of claim 13, wherein ablating the at least one elongate depression comprises ablating at least one elongated depression extending substantially in a major plane of the semiconductor substrate.

20. The method of claim 13, wherein ablating at least one elongate depression extending into but not through the second dielectric layer and at least one discrete depression extending through a bottom of the at least one elongate depression through the second dielectric layer and into the first dielectric layer comprises ablating a plurality of discrete depressions extending through a bottom of the at least one elongate depression through the second dielectric layer and into the first dielectric layer.

21. A method for forming a semiconductor device assembly, comprising:
- providing a plurality of semiconductor dice, each semiconductor dice of the plurality having an active surface and a plurality of bond pads thereon;
- providing a plurality of carrier substrates, each carrier substrate of the plurality having a plurality of terminal pads on a surface thereof;
- forming a first dielectric layer over the plurality of bond pads of the plurality of semiconductor dice;
- forming a second dielectric layer over the first dielectric layer;
- laser ablating at least one elongate depression extending into but not through the second dielectric layer and at least one discrete depression extending through the second dielectric layer and substantially through the first dielectric layer for electrically accessing at least one of the plurality of bond pads of the plurality of semiconductor dice;
- depositing a conductive material at least partially into the at least one elongate depression and the at least one discrete depression;
- positioning the at least one discrete depression proximate to at least one of the plurality of terminal pads so as to allow direct contact between the conductive material and at least one of the plurality of terminal pads with electrical communication therebetween; and
- affixing the plurality of semiconductor dice to the plurality of carrier substrates.

22. The method of claim 21, further comprising at least partially melting the conductive material within the at least one discrete depression to form an electrically conductive structure between the at least one bond pad of the plurality of bond pads and the at least one terminal pad of the plurality of terminal pads.

23. The method of claim 22, further comprising compressing the second dielectric layer between the at least one semiconductor die and the at least one carrier substrate during at least partially melting the conductive material.

24. The method of claim 21, further comprising at least partially melting the second dielectric layer.

25. The method of claim 24, further comprising compressing the conductive material between the at least one semiconductor die and the at least one carrier substrate during at least partially melting the second dielectric layer.

26. The method of claim 24, further comprising affixing the at least one semiconductor die to the at least one carrier substrate by at least partially melting the second dielectric layer.

27. The method of claim 21, wherein laser ablating at least one discrete depression extending through the second dielectric layer and substantially through the first dielectric layer comprises laser ablating a surface of the first dielectric layer proximate to a surface of each of the plurality of bond pads of the at least one semiconductor die.

28. The method of claim 27, further comprising etching the laser ablated surface of the at least one discrete depression to expose at least a portion of the at least one of the plurality of bond pads of the at least one semiconductor die.

29. The method of claim 21, further comprising forcing the at least one semiconductor die toward the carrier substrate while affixing the at least one semiconductor die to the at least one carrier substrate.

30. The method of claim 21, wherein providing the at least one semiconductor die comprises providing a plurality of semiconductor dice in an unsingulated state on a bulk semiconductor substrate, providing the at least one carrier substrate comprises providing a like plurality of carrier substrates in an unsingulated state comprising a bulk substrate, and further comprising singulating semiconductor dice of the plurality, each having a carrier substrate associated therewith, after affixing the plurality of semiconductor dice to the like plurality of carrier substrates.

* * * * *

UNITED STATES PATENT AND TRADEMARK OFFICE
CERTIFICATE OF CORRECTION

| | |
|---|---|
| PATENT NO. | : 7,629,250 B2 |
| APPLICATION NO. | : 11/601341 |
| DATED | : December 8, 2009 |
| INVENTOR(S) | : Peter A. Benson et al. |

Page 1 of 1

It is certified that error appears in the above-identified patent and that said Letters Patent is hereby corrected as shown below:

In column 18, line 11, in Claim 13, after "layer" insert -- ; --.

Signed and Sealed this

Sixteenth Day of February, 2010

David J. Kappos
*Director of the United States Patent and Trademark Office*